(12) United States Patent
Ikeda et al.

(10) Patent No.: US 10,473,782 B2
(45) Date of Patent: Nov. 12, 2019

(54) PHOTOELECTRIC CONVERSION ELEMENT, PHOTOELECTRIC CONVERSION APPARATUS USING THE SAME, DISTANCE DETECTION SENSOR, AND INFORMATION PROCESSING SYSTEM

(71) Applicant: CANON KABUSHIKI KAISHA, Tokyo (JP)

(72) Inventors: Hajime Ikeda, Yokohama (JP); Tatsuhito Goden, Machida (JP); Yoichi Wada, Yokohama (JP); Keisuke Ota, Tokyo (JP); Toshinori Hasegawa, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 497 days.

(21) Appl. No.: 15/228,946

(22) Filed: Aug. 4, 2016

(65) Prior Publication Data
US 2017/0038471 A1 Feb. 9, 2017

(30) Foreign Application Priority Data

Aug. 7, 2015 (JP) ................................. 2015-157641

(51) Int. Cl.
*G01S 17/08* (2006.01)
*H01L 27/14* (2006.01)
(Continued)

(52) U.S. Cl.
CPC ............. *G01S 17/08* (2013.01); *G01S 7/4863* (2013.01); *G01S 7/4914* (2013.01); *G01S 17/89* (2013.01);
(Continued)

(58) Field of Classification Search
CPC ............. H01L 31/173; H01L 27/14614; H01L 27/14643; G01S 17/08; G01S 17/89; G01S 17/93; G01S 17/936
See application file for complete search history.

(56) References Cited

U.S. PATENT DOCUMENTS 9,344,657 B2 * 5/2016 Kim ........................ G01C 15/06
2007/0103748 A1 * 5/2007 Hashimoto ....... H01L 27/14609
359/15

FOREIGN PATENT DOCUMENTS

JP 2005-303268 A 10/2005

* cited by examiner

*Primary Examiner* — Matthew L Reames
(74) *Attorney, Agent, or Firm* — Canon U.S.A., Inc. IP Division

(57) ABSTRACT

A photoelectric conversion element includes a first photoelectric conversion unit configured to generate an electron serving as a signal charge, a second photoelectric conversion unit configured to generate a hole serving as a signal charge, a first floating diffusion region to which the electron generated in the first photoelectric conversion unit is transferred, a second floating diffusion region to which the hole generated in the second photoelectric conversion unit is transferred, an amplifying transistor including a gate electrically connected to the first floating diffusion region and the second floating diffusion region, a first charge ejection unit configured to eject the electron generated in the first photoelectric conversion unit, and a second charge ejection unit configured to eject the hole generated in the second photoelectric conversion unit, wherein the first photoelectric conversion unit and the second photoelectric conversion unit are arranged along a principal surface of a semiconductor substrate.

19 Claims, 12 Drawing Sheets

(51) Int. Cl.
*G01S 17/93* (2006.01)
*G05D 1/02* (2006.01)
*H01L 27/146* (2006.01)
*H01L 31/173* (2006.01)
*G01S 17/89* (2006.01)
*G01S 7/486* (2006.01)
*G01S 7/491* (2006.01)

(52) U.S. Cl.
CPC ............ *G01S 17/93* (2013.01); *G01S 17/936* (2013.01); *G05D 1/0238* (2013.01); *H01L 27/14614* (2013.01); *H01L 27/14643* (2013.01); *H01L 31/173* (2013.01)

PHOTOELECTRIC CONVERSION ELEMENT, PHOTOELECTRIC CONVERSION APPARATUS USING THE SAME, DISTANCE DETECTION SENSOR, AND INFORMATION PROCESSING SYSTEM

BACKGROUND OF THE INVENTION

Field of the Invention

The present disclosure relates to a photoelectric conversion element and a photoelectric conversion apparatus.

Description of the Related Art

Conventionally, a distance detection sensor of a time-of-flight (TOF) type is known.

Japanese Patent Laid-Open No. 2005-303268 discloses an example of a distance detection sensor. In this example, as illustrated in FIGS. 9A to 9C of Japanese Patent Laid-Open No. 2005-303268, the distance detection sensor includes a first photosensitive unit 11a, a second photosensitive unit 11b, a hole holding unit 13 configured to hold holes generated in the first photosensitive unit 11a, and an electron holding unit 14 configured to hold electrons generated in the second photosensitive unit 11b. When the holes generated in the first photosensitive unit 11a are transferred to the hole holding unit 13, a gate unit 38a is turned on and a gate unit 38b is turned off. On the other hand, when the electrons generated in the second photosensitive unit 11b are transferred to the electron holding unit 14, the gate unit 38b is turned on and the gate unit 38a is turned off. The electrons accumulated in the electron holding unit 14 and the holes accumulated in the hole holding unit 13 are recombined in a recombination unit 15. In the technique disclosed in Japanese Patent Laid-Open No. 2005-303268, it described that it is not necessary to provide an ejection unit for ejecting electrons held in a light emission-off period.

SUMMARY OF THE INVENTION

According to an aspect of the present disclosure, a photoelectric conversion element includes a first photoelectric conversion unit configured to generate an electron serving as a signal charge, a second photoelectric conversion unit configured to generate a hole serving as a signal charge, a first floating diffusion region to which the electron generated in the first photoelectric conversion unit is transferred, a second floating diffusion region to which the hole generated in the second photoelectric conversion unit is transferred, an amplifying transistor including a gate electrically connected to the first floating diffusion region and the second floating diffusion region, a first charge ejection unit configured to eject the electron generated in the first photoelectric conversion unit, and a second charge ejection unit configured to eject the hole generated in the second photoelectric conversion unit, wherein the first photoelectric conversion unit and the second photoelectric conversion unit are arranged along a principal surface of a semiconductor substrate.

Further features of the disclosure will become apparent from the following description of exemplary embodiments with reference to the attached drawings.

DESCRIPTION OF THE EMBODIMENTS

Figure 1A:
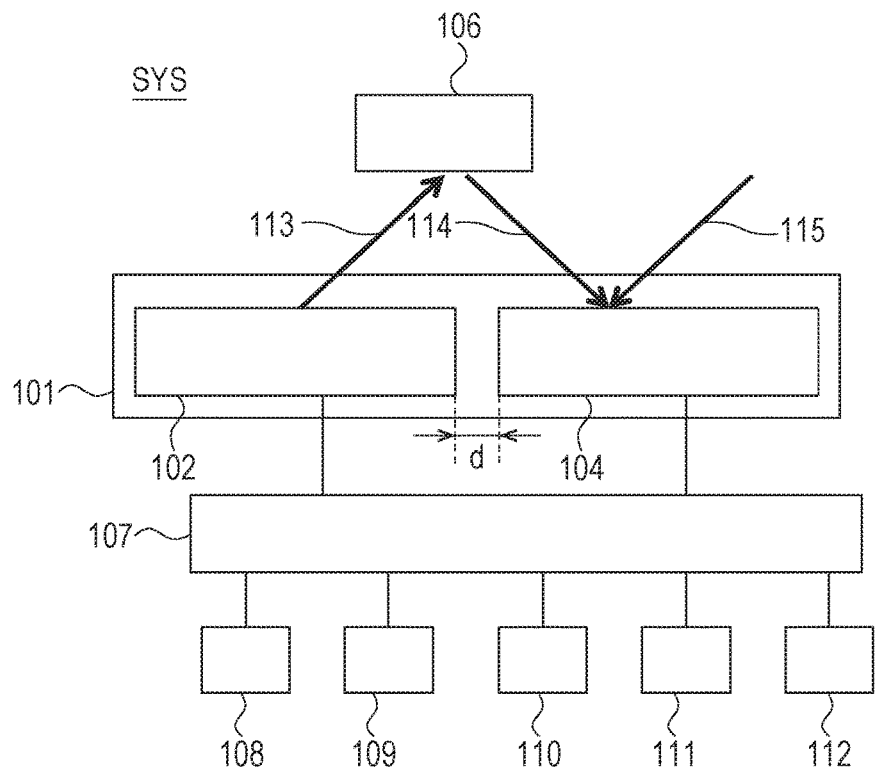
FIG. 1A is a block diagram of an information processing system.

Embodiments of the present disclosure are described below. In the following description and drawings, similar elements are denoted by similar reference numerals, and a description given once somewhere for similar elements is not repeated unless a further description is necessary.

First Embodiment

Referring to FIG. 1A, a description is given below as to an information processing system SYS including a light receiving apparatus 102 serving as a light emitting unit and a photoelectric conversion apparatus 104 serving as a light emitting unit. There may be a distance "d" between the light emitting apparatus 102 and the photoelectric conversion apparatus 104. In this example, the photoelectric conversion apparatus 104 is included in a distance detection sensor 101 serving as a distance measurement apparatus. The information processing system SYS further includes an information processing apparatus 107 in addition to the distance detection sensor 101. The information processing system SYS may further includes at least one of an image capturing apparatus 108, an input apparatus 109, a driving apparatus 110, a display apparatus 111, and a communication apparatus 112. An example of an application of the information processing system SYS will be described below.

The distance detection sensor 101 includes the light emitting apparatus 102 and the photoelectric conversion apparatus 104, and is configured to detect a distance using a time-of-flight (TOF) method.

The light emitting apparatus 102 alternately turns on and off light emission. When the light emitting apparatus 102 turns on, light 113 emitted from the light emitting apparatus 102 is reflected by a target 106, and resultant reflected light 114 is incident on the photoelectric conversion apparatus 104. When the light emitting apparatus 102 turns off, there is no reflected light 114 originating from the light 113 emitted from the light emitting apparatus 102. Therefore, an environmental light 115, which originates from a light source different from the light emitting apparatus 102, is incident on the photoelectric conversion apparatus 104.

It may be advantageous to use a light emitting diode to realize the light emitting apparatus 102, because the light emitting diode is capable of quickly repeating a turning-on/off operation. The wavelength of the light emitted by the light emitting apparatus 102 may be set in an infrared range which is not visible to human eyes and does not interfere with a circumstance. However, the wavelength is not limited to the infrared range. At least one of the light emitting apparatus 102 and the photoelectric conversion apparatus 104 may include an optical system. The optical system may include a lens, an aperture, a mechanical shutter, a scattering plate, an optical lowpass filter, a wavelength selective filter, and/or the like. In a case where a laser is used as a light emitting device, the light emitting apparatus 102 may include a scanning optical system configured to scan the light emitted from the light emitting apparatus 102 toward a particular area.

A time difference occurs between a time at which light is emitted by the light emitting apparatus 102 and a time at which the light is received by the photoelectric conversion apparatus 104. This time difference depends on the speed of light ($3.0 \times 10^8$ m/s) and the distance between the distance detection sensor 101 and the target 106. By detecting a physical quantity related to the time difference, it is possible to detect the distance from the distance detection sensor 101 to the target 106, and/or it is possible to obtain information in the form of, for example, an image based on the distance.

If the distance "d" between the light emitting apparatus 102 and the photoelectric conversion apparatus 104 is large, a complicated distance measurement algorithm is necessary. Therefore, it may be advantageous to set the distance "d" between the light emitting apparatus 102 and the photoelectric conversion apparatus 104 to be smaller than required distance measurement accuracy. In view of the above, the distance "d" between the light emitting apparatus 102 and the photoelectric conversion apparatus 104 may be set, for example, in a range of 1 cm to 100 cm.

Note that light incident on the photoelectric conversion apparatus 104 includes, in addition to the reflected light 114 originating from the light emitted from the light emitting apparatus 102, the environmental light 115 originating from a light source in the environment different from the light emitting apparatus. The light source of the environmental light 115 may be natural light or artificial light. In measuring the distance, the environmental light 115 causes a noise component. Therefore, in a case where the ratio of the environmental light 115 to the total amount of light received by the distance detection sensor 101 is high, it becomes difficult to obtain a large dynamic range of the signal of the signal light, i.e., the reflected light 114, or it becomes difficult to obtain a large signal-to-noise (S/N) ratio. Thus, it becomes difficult to obtain high-accuracy distance information from the reflected light 114.

In view of the above, the photoelectric conversion apparatus 104 according to the present embodiment is capable of precisely removing a signal component originating from environmental light from a total signal component generated by the photoelectric conversion apparatus. The total signal component includes a signal component originating from the reflected light 114 originating from the light emitted by the light emitting apparatus 102 and the signal component from the environmental light.

Figure 1B:
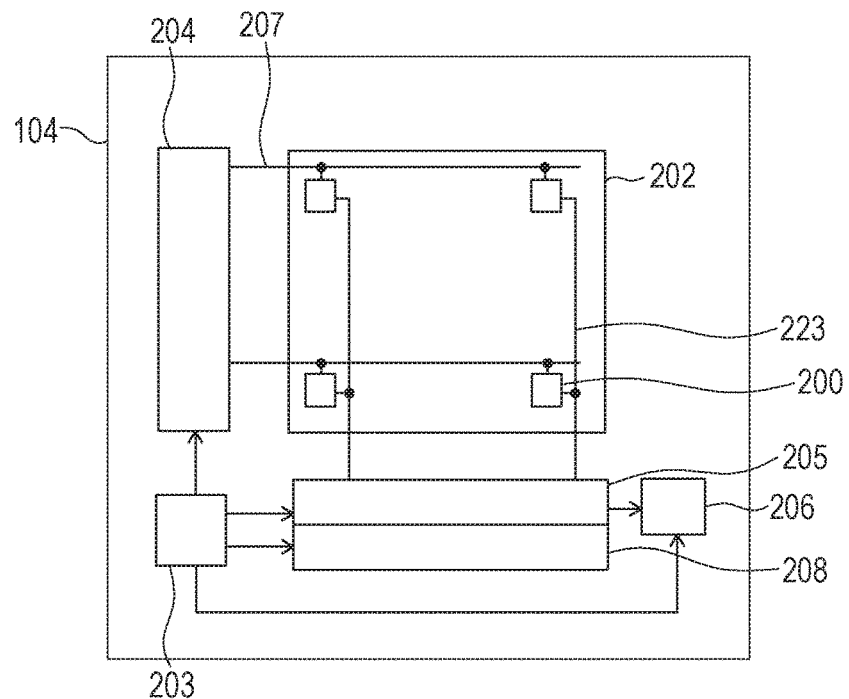
FIG. 1B is a block diagram of a photoelectric conversion apparatus.

FIG. 1B is a block diagram illustrating an example of a configuration of the photoelectric conversion apparatus 104 according to an embodiment. The photoelectric conversion apparatus 104 includes a photoelectric conversion area 202, a control signal generation unit 203, a vertical scanning circuit 204, a signal processing unit 205, an output unit 206, and a signal line 223.

The photoelectric conversion area 202 is an area in which a plurality of photoelectric conversion elements 200 are disposed or arranged in the form of a two-dimensional array. Each of the plurality of photoelectric conversion elements 200 is configured to convert incident light into an electric signal and output the resultant electric signal. The photoelectric conversion elements 200 are connected on a row-by-row basis to the vertical scanning circuit 204 via a corresponding row wiring (scanning line) 207. The vertical scanning circuit 204 supplies a control signal via one of row wirings 207 to photoelectric conversion elements 200 located on the corresponding row in the photoelectric conversion area 202. Examples of the control signals are pSEL1, pSEL2, pRES1, pRES2, pTX1, and pTX2, which will be described in detail later. In what follows, the term "wiring" refers to a connection that is made of an electrically conductive material.

The photoelectric conversion elements 200 are also connected on a column-by-column basis to the signal processing unit 205 via corresponding signal lines 223.

The signal processing unit 205 processes signals output from the photoelectric conversion area 202. The signal processing unit 205 may include signal processing circuits such as CDS (correlated double sampling) circuits, amplifier circuits, analog-to-digital converters and/or the like provided in the respective columns of the photoelectric conversion area 202. The scanning unit 208 sequentially outputs the signals, processed by the signal processing unit 205 for the respective columns, from the signal processing unit 205 to the output unit 206.

The output unit 206 outputs the signal from the signal processing unit 205 to elements external to the photoelectric conversion apparatus 104. The output unit 206 may include an amplifier circuit, a protection circuit, an electrode for connection to an external circuit, and/or the like. The control signal generation unit 203 generates the control signal described above thereby controlling operation timings of the vertical scanning circuit 204, the signal processing unit 205, the scanning unit 208, and the output unit 206.

Figure 2:
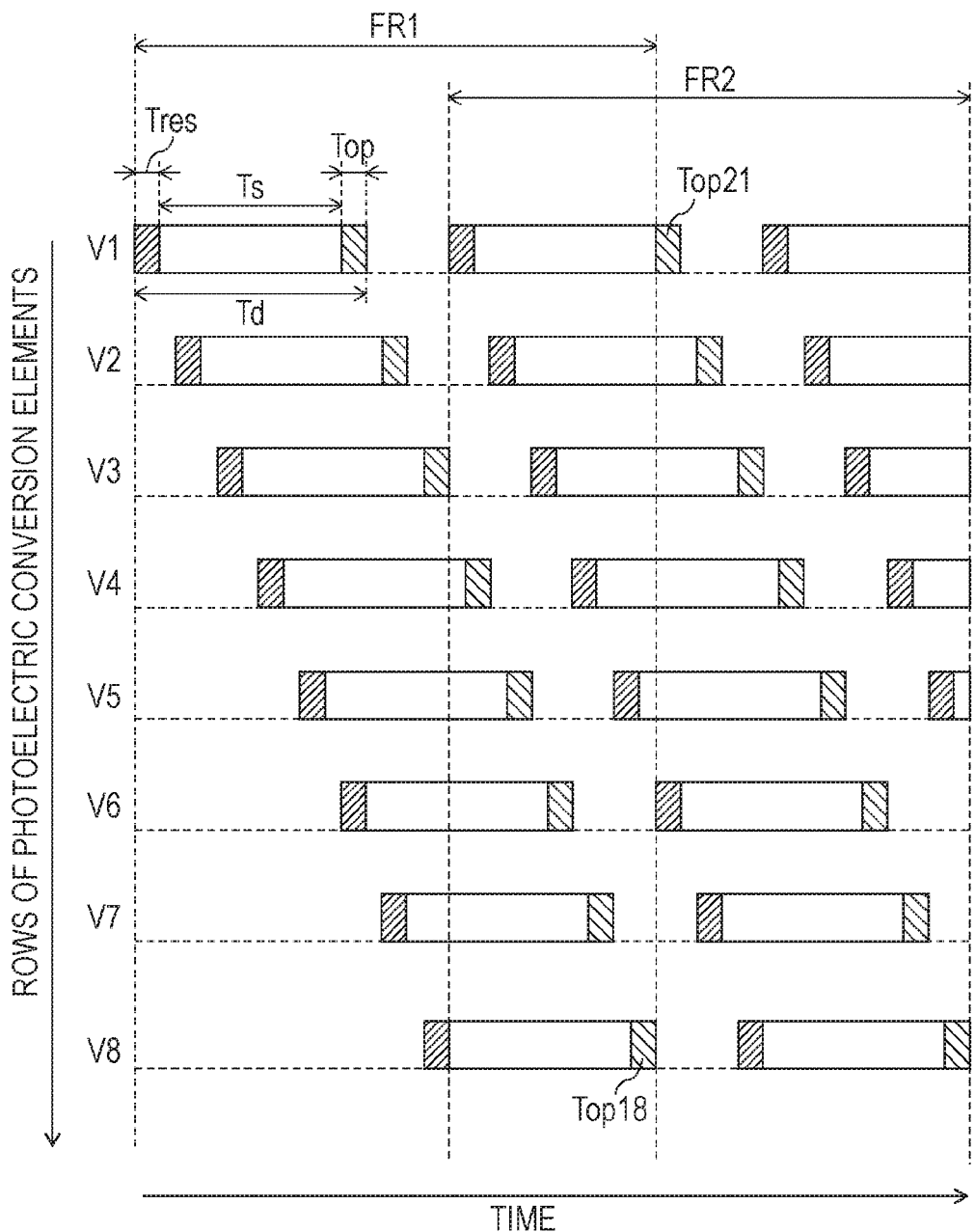
FIG. 2 is a diagram illustrating a method of driving a photoelectric conversion apparatus.

FIG. 2 illustrates an example of an operation for a case where the photoelectric conversion area 202 includes eight rows of the photoelectric conversion elements 200 in the photoelectric conversion apparatuses 104. In this example, it is assumed that progressive scanning is performed over eight rows from the first row V1 to the eighth row V8. Note that interlace scanning may be employed instead of progressive scanning.

A driving period Td of one photoelectric conversion element 200 includes a reset period Tres in which a reset operation is performed, a charge accumulation period Ts in which a charge is accumulated, and an output period Top in which a signal is output to the signal line 223 based on the accumulated charge. The driving period Td may further include a period in which another operation is performed. A plurality of photoelectric conversion elements 200 located in the same row are driven at the same time in the same driving period Td.

Signals output from the plurality of photoelectric conversion elements 200 located in the same row of the photoelectric conversion area 202 are processed by the signal processing unit 205 shown in FIG. 1B and output to the output unit 206.

In a frame period, a reset operation, an accumulation operation, and an output operation are performed for all rows of photoelectric conversion elements 200 in the photoelectric conversion area 202. For example, a start point of a first frame period FR1 is a point of time at which a reset operation is started for a first row V1 of the photoelectric conversion area 202. An end point of the first frame period FR1 is a point of time at which an output operation of the photoelectric conversion element 200 in the eighth row V8 is ended. A start point of a second frame period FR2 is a point of time at which a reset operation of the first row V1 is started for the first time after the end of the output operation of the first row V1 in the first frame period FR1. An end point of the second frame period FR2 is a point of time at which an output operation for the eighth row V8 is ended for the first time after the end of the output operation of the eighth row V8 in the first frame period FR1.

By performing the accumulation operation in parallel for a plurality of rows (about five rows in the present example), it becomes possible to increase the accumulation period, which makes it possible to increase the output of the signal obtained in the accumulation period. When the accumulation operation is performed in parallel for a plurality of rows, it is possible to separate signals among the plurality of rows by shifting the timing of performing the output operation among the rows.

Furthermore, as illustrated in FIG. 2, a part of the first frame period FR1 overlaps a part of the second frame period FR2. As a result of this overlap, an output period Top of a first row in the second frame period FR2 (e.g., Top21) starts after the end of an output period Top of a last row of the first frame period FR1 (e.g., Top18), thereby achieving an improvement in frame rate while suppressing interference of signals of rows of photoelectric conversion elements between the first frame period FR1 and the second frame period FR2.

Alternatively, after the reset operation, the accumulation operation, and the output operation are all completed for one row, the reset operation, the accumulation operation, and the output operation for a next row may be started. Alternatively, after the output operation for the last row (e.g., the eighth row) is completed, the reset operation for the first row may be started.

Figure 3A:
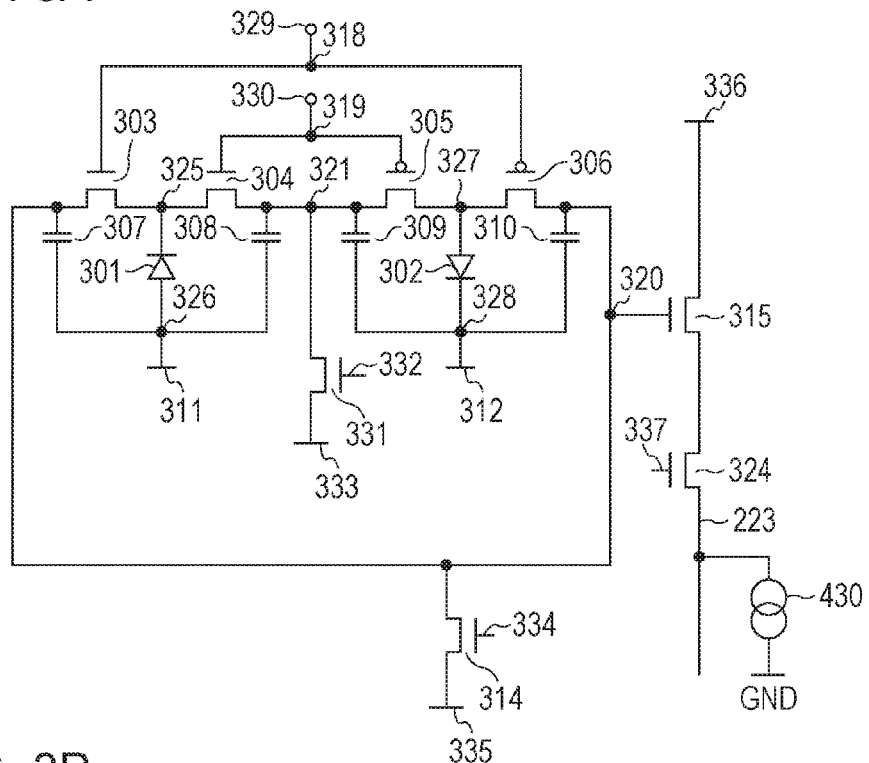
FIGS. 3A and 3B each illustrate an equivalent circuit of a photoelectric conversion element.
Figure 3B:
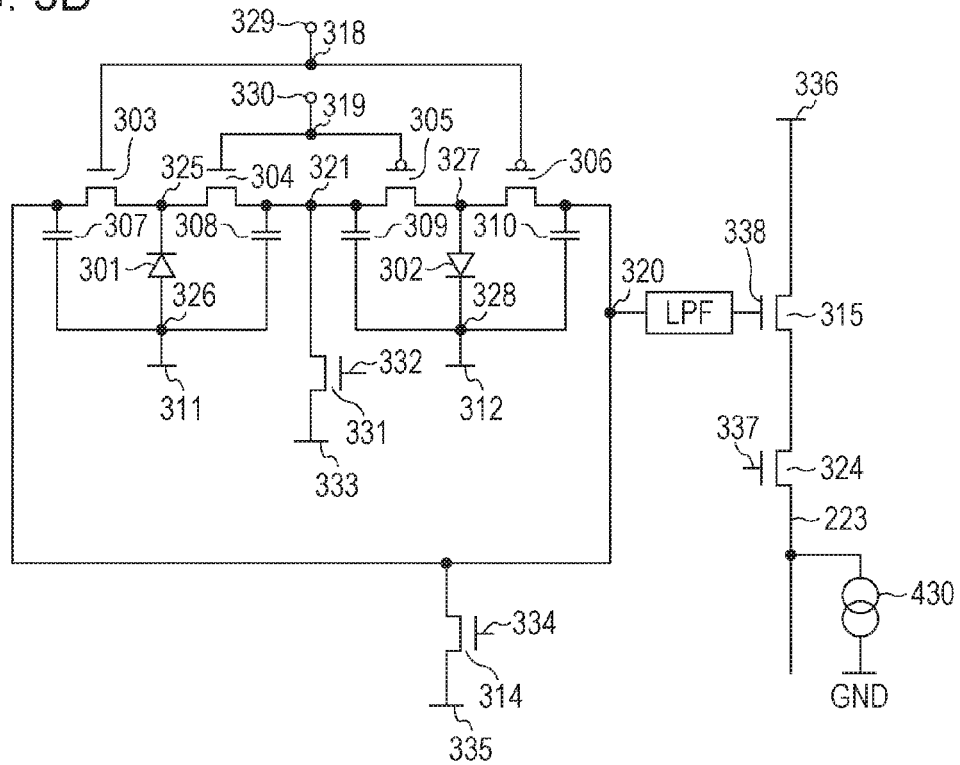

Next, an example of a structure of the photoelectric conversion cell 111 is described below. FIGS. 3A and 3B each illustrates an example of an equivalent circuit of the photoelectric conversion element 200. The example shown in FIG. 3B is different from the example shown in FIG. 3A in that a lowpass filter circuit is additionally provided. Hereinafter, for simplicity, the floating diffusion region will be referred to as FD. Furthermore, a semiconductor region of a first conductivity type is assumed by way of example to be an N-type semiconductor region and a semiconductor region of a second conductivity type is assumed by way of example to be a P-type semiconductor region.

The photoelectric conversion element 200 includes a photoelectric conversion unit 301 (first photoelectric conversion unit), a photoelectric conversion unit 302 (second photoelectric conversion unit), an FD 307 (first floating diffusion region), an FD 310 (second floating diffusion region), a charge ejection unit 308 (first charge ejection unit), and a charge ejection unit 309 (second charge ejection unit). The photoelectric conversion element 200 further includes a transfer transistor 303, a transfer transistor 304, a transfer transistor 305, a transfer transistor 306, a reset transistor 314, a reset transistor 331, a first amplification unit 315, and a first selection unit 324.

The photoelectric conversion unit 301 generates an electron serving as a signal charge by photoelectric conversion, and the photoelectric conversion unit 302 generates a hole serving as a signal charge by photoelectric conversion. That is, the polarity of the signal charge is opposite between the photoelectric conversion unit 301 and the photoelectric conversion unit 302. Note that in the photoelectric conversion unit 301, not only the electron but also a hole is generated, while in the photoelectric conversion unit 302 not only the hole but also an electron is generated. However, these charges are respectively ejected via the reference potential supply units 311 and 312, and they are not treated as signal charges.

In the present embodiment, by way of example, photodiodes are used as the photoelectric conversion units 301 and 302, although the photoelectric conversion units 301 and 302 are not limited to photodiodes. The photodiode serving as the photoelectric conversion unit 301 includes a cathode 325 realized with an N-type semiconductor region in which electrons behave as majority carriers and an anode 326 realized with a P-type semiconductor region in which electrons behave as minority carriers. The photodiode serving as the photoelectric conversion unit 302 includes an anode 327 realized with a P-type semiconductor region in which holes behave as majority carriers and a cathode 328 realized with an N-type semiconductor region in which holes behave as minority carriers.

The FD 307 is a capacitor unit to which the electrons generated as the signal charge in the photoelectric conversion unit 301 are transferred, and the FD 310 is a capacitor unit to which the holes generated as the signal charge in the photoelectric conversion unit 302 are transferred. The FD 307 and the FD 310 each function as a charge-voltage conversion unit that converts the transferred charge to a voltage. The FD 307 is realized with an N-type semiconductor region in a PN junction diode structure, and the FD 310 is realized with a P-type semiconductor region in a PN junction diode structure. The FD 307 and the FD 310 are capable of holding the charges transferred from the corresponding photoelectric conversion units.

The electrons generated in the photoelectric conversion unit 301 are ejected to the charge ejection unit 308, and the holes generated in the photoelectric conversion unit 302 are ejected to the charge ejection unit 309. As will be described in detail later, there is basically no overlap between a period in which the electrons (holes) generated in the photoelectric conversion unit 301 (302) are transferred to the FD 307 (310) and a period in which the electrons (holes) generated in the photoelectric conversion unit 301 (302) are ejected to the charge ejection unit 308 (309). On the other hand, there is an overlap between the period in which the electrons (holes) generated in the photoelectric conversion unit 301 (302) are transferred to the FD 307 (310) and a period in which the holes (electrons) generated in the photoelectric conversion unit 302 (301) are ejected to the charge ejection unit 309 (308). Note that the charge ejection unit 308 and the charge ejection unit 309 are set to be at a particular potential via, for example, a reset transistor 331 described below.

Of two types of charges, i.e., electrons and holes generated in the photoelectric conversion unit 301, the electrons serving as the signal charge are transferred to the FD 307 via the transfer transistor 303. Of two types of charges, i.e., electrons and holes generated in the photoelectric conversion unit 302, the holes serving as the signal charge are transferred to the FD 310 via the transfer transistor 306. The transfer transistor 303 and the transfer transistor 306 each has a MIS-type gate structure. That is, the transfer transistor 303 and the transfer transistor 306 each has a multilayer structure (a transfer gate structure) including a semiconductor region (channel region), a gate insulating film, and a gate electrode. When the transfer transistor 303 is in an ON state (conductive state), an N-type channel is formed in the semiconductor region by inversion. When the transfer transistor 306 is in an ON state, a P-type channel is formed in the semiconductor region by inversion.

In the present example, the gate electrode of the transfer transistor 303 and the gate electrode of the transfer transistor 306 are connected together to the transfer node 318. The transfer node 318 is also connected to a transfer signal supply unit 329 such that a control signal pTX1 is input to the transfer node 318 from the transfer signal supply unit 329. The transfer transistor 303 and the transfer transistor 306 are different from each other in terms of the conductivity type such that they operate in a complementary manner. Therefore, when the transfer transistor 303 is in the ON state according to the control signal TX1, the transfer transistor 306 is in the OFF state (non-conductive state), while when the transfer transistor 303 is in the OFF state according to the control signal TX1, the transfer transistor 306 is in the ON state.

There is a potential difference in a range, for example, from 1 V to 5V between the potential HIGH (H-level in FIG. 4A described below) that causes the transfer transistor 303 to be in the ON state (conductive state) and the potential MID (0-level in FIG. 4A) that causes the transfer transistor 303 to be in the OFF state. There is also a potential difference in a range, for example, from 1 V to 5V between the potential LOW (L-level in FIG. 4A) that causes the transfer transistor 306 to be in the ON state and the potential MID (0-level in FIG. 4A) that causes the transfer transistor 306 to be in the OFF state. It may be advantageous that the potential HIGH is set to be (positive and) higher than the ground potential GND, while the potential LOW is set to be (negative and) lower than the ground potential GND. For example, the potential MID may be set to be equal to the ground potential GND. Note that the potential HIGH, the potential MID, and the potential LOW may all be set to be positive, or conversely the potential HIGH, the potential MID, and the potential LOW may all be set to be negative, which may result in a reduction in circuit complexity.

Note that the transfer transistor 303 and the transfer transistor 306 may be connected to different nodes, and turning-on/off of the transfer transistor 303 and the transfer transistor 306 may be controlled individually according to separate control signals. However, it may be more advantageous to connect the transfer transistor 303 and the transfer transistor 306 to the common transfer node 318, and input the same control signal TX1 to the gate electrodes of the transfer transistor 303 and the transfer transistor 306. This makes it possible to more accurately control the timing of turning on/off the transfer transistor 303, and the transfer transistor 306. Furthermore, it is possible to drive the transfer transistors 303 and 306 using a common driving circuit and a common wiring, and thus it is possible to simplify the configuration of the photoelectric conversion element 200.

As described above, the FD 307 is connected to the cathode 325 via the transfer transistor 303. The FD 310 is connected to the anode 327 via the transfer transistor 306.

The FD 307 and the FD 310 are connected to a reference power supply 335 via the reset transistor 314. More specifically, the reference power supply 335 provides a ground potential (GND) or a power supply potential Vdd. It may be advantageous that the reference power supply 335 has a voltage in a range from −2V to +2V. The reset transistor 314 receives a control signal pRES1 from a reset signal supply unit 334.

The transfer transistor 304 performs transferring such that electrons, of electrons and holes generated in the photoelectric conversion unit 301, are transferred to the charge ejection unit 308. The transfer transistor 305 performs transferring such that holes, of electrons and holes generated in the photoelectric conversion unit 302, are transferred to the charge ejection unit 309. The transfer transistor 304 and the transfer transistor 305 each has a MIS-type gate structure.

That is, the transfer transistors 304 and 305 each has a multilayer structure including a semiconductor region (channel region), a gate insulating film, and a gate electrode. When the transfer transistor 304 is in the ON state, an N-type channel is formed in the semiconductor region by inversion. When the transfer transistor 305 is in an ON state, a P-type channel is formed in the semiconductor region by inversion.

In the present example, the gate electrode of the transfer transistor 304 and the gate electrode of the transfer transistor 305 are connected together to a transfer node 319, and the transfer node 319 is also connected to a transfer signal supply unit 330 such that a control signal pTX2 is input to the transfer node 319 from the transfer signal supply unit 330. The transfer transistor 304 and the transfer transistor 305 are different from each other in terms of the conductivity type. Therefore, when the transfer transistor 304 is in the ON state according to the control signal TX2, the transfer transistor 305 is in the OFF state, while when the transfer transistor 304 is in the OFF state according to the control signal TX2, the transfer transistor 305 is in the ON state.

It may be advantageous that threshold voltages of the transfer transistor 304 and the transfer transistor 305 are set such that when the transfer node 319 is at a particular potential, the transfer transistor 304 and the transfer transistor 305 are both in the OFF state. The particular potential may be determined based on the potential of semiconductor regions of the MIS structure and the threshold voltages of the transfer gates.

Note that the transfer transistor 304 and the transfer transistor 305 may be respectively connected to different nodes, and turning-on/off of the transfer transistor 304 and the transfer transistor 305 may be controlled individually according to separate control signals. However, it may be more advantageous to connect the transfer transistor 304 and the transfer transistor 305 to the common transfer node 319, and input the same control signal TX2 to the gate electrodes of the transfer transistor 304 and the transfer transistor 305. This makes it possible to more accurately control the timing of turning-on/off the transfer transistor 304 and the transfer transistor 305. Furthermore, it is possible to drive the transfer transistors 304 and 305 using a common driving circuit and a common wiring, and thus it is possible to simplify the configuration of the photoelectric conversion element 200.

The charge ejection unit 308 and the charge ejection unit 309 are connected to a node 321. The node 321 is connected to a reference power supply 333, for example, via the reset transistor 331. The reset transistor 331 receives a control signal pRES2 from a reset signal supply unit 332. Although in the present example, the charge ejection unit 308 and the charge ejection unit 309 are connected to the reference power supply 333 via the reset transistor, the node 321 may be directly connected to the reference power supply 333 without passing through the reset transistor.

The anode 326 of the photoelectric conversion unit 301 and the FD 307 are connected to the reference potential supply unit 311 such that a reference potential VF1 is supplied in common thereto. The cathode 328 of the photoelectric conversion unit 302 and the FD 310 are connected to the reference potential supply unit 312 such that a reference potential VF2 is supplied in common thereto from the reference potential supply unit 312.

A detection node 320 is connected to the FD 307, the FD 310, a main electrode (a source or a drain) of the reset transistor 314, and electrically conductive materials connecting them The detection node 320 is electrically connected to a gate of the first amplification unit 315 described below. Thus, a potential appears at the detection node 320 depending on the amounts of charges transferred to the FD 307 and the FD 310 and the capacitance of the detection node 320, and this potential is applied to the gate of the first amplification unit 315.

In the present example, the FD 307 and the FD 310 are directly connected to each other via the electrically conductive material, and thus the FD 307, the FD 310, and the detection node 320 are at substantially the same potential. The electrically conductive material has a conductivity equal to or larger than $10^4$ S/m (a specific resistance equal to or smaller than $10^{-4}$ Ω·m). Note that the insulator has a conductivity equal to or smaller than $10^{-7}$ S/m (a specific resistance equal to or larger than $10^7$ Ω·m). The semiconductor has a conductivity in a range of $10^{-7}$ S/m to $10^4$ S/m (a specific resistance in a range of $10^{-4}$ Ω·m to $10^7$ Ω·m). Examples of electrically conductive materials usable here include metals, metallic compounds, graphite, polycrystalline silicon, etc. Silicon with a high-concentration impurity (with a concentration equal to or higher than $10^{19}$/cm$^3$) can behave like an electrically conductive material. The connection between the FD 307 and the FD 310 via the electrically conductive material makes it possible to smoothly transfer electrons between the FD 307 and the FD 310, which allows a reduction in time needed for the potential of the FD 307 and the FD 310 (the potential at the detection node 320) to settle. Alternatively, a switch may be provided between the FD 307 and detection node 320 and/or a switch may be provided between the FD 310 and detection node 320 such that at least two of the FD 307, the FD 310, and the detection node 320 are allowed to be at different potentials.

In the configuration shown in FIG. 3A or 3B, a transient phenomenon may occur as described below. First, a difference occurs between the number of electrons transferred to the FD 307 and the number of holes transferred to the FD 310, and this difference causes a potential difference to occur between the FD 307 and the FD 310. Electrons move between the FD 307 and the FD 310 via the electrically conductive material so as to reduce the potential difference described above. As a result, the detection node 320 has a potential corresponding to the difference between the charge of electrons transferred to the FD 307 and the charge of holes collected in the FD 310.

Hereinafter, let VN1 and VN2 denote the respective potentials of the FD 307 and the FD 310. To easily transfer electrons from the cathode 325 of the photoelectric conversion unit 301 to the FD 307, the reference potential VF1 may be set such that VF1<VN1. Note that VN1 and VN2 may be regarded as potential values of the FD 307 and the FD 310 obtained typically when the detection node 320 is reset by the reset transistor 314.

To easily transfer holes from the anode 327 of the photoelectric conversion unit 302 to the FD 310, potentials may be set such that VN2<VF2. When VF1<VN1 and VN2<VF2, if VN1=VN2, then VF1<VF2. Setting the reference potential VF2 to be higher than the reference potential VF1 (VF1<VF2) as described above makes it possible to achieve higher accuracy in distance measurement than is possible when the reference potential VF2 is equal to or lower than the reference potential VF1 (VF1≥VF2). By making the setting in the above-described manner, it is possible to achieve a high charge collection efficiency, a high-speed operation, and high-accuracy signal acquisition. In practice, it may be advantageous to set the potential VF1 and the potential VF2 such that the difference between them is equal to or larger than 0.10 V. To achieve this, in the present example, two reference potential supply units, i.e., the reference potential supply unit 311 and the reference potential supply unit 312, are provided. Note that the potential VF1 and the potential VF2 are typically set so as to have a potential difference in a range of 1 V to 5V. Note that the reference potential VF1 may be set to be lower than the ground potential (GND) (VF1<GND), and the reference potential VF2 may be set to be higher than the ground potential (GND) (GND<VF2). That is, the reference potential VF1 may be negative, and the reference potential VF2 may be positive.

In the present example, the first amplification unit 315 is a MOS transistor (amplifying transistor) including a gate, a source, and a drain. The first amplification unit 315 forms, together with a constant current source 430, a source follower circuit. The gate of the first amplification unit 315 is electrically connected to the detection node 320. The first amplification unit 315 amplifies a signal based on the potential of the detection node 320 and outputs the resultant amplified signal. The drain of the first amplification unit 315 is connected to the power supply unit 336 such that a power supply voltage VDD is supplied thereto. The first amplification unit 315 outputs the amplified signal to the drain of the first selection unit 324.

The first selection unit 324 controls outputting signals from a plurality of photoelectric conversion elements 200 disposed for each signal line 223 such that a signal is output from one photoelectric conversion element at a time to the signal line 223 or signals from a plurality of photoelectric conversion elements are output at a time to the signal line 223. The drain of the first selection unit 324 is connected to the source of the first amplification unit 315, the source of the first selection unit 324 is connected to the signal line 223, and the gate of the first selection unit 324 is connected to the selection signal supply unit 337. In practice, the first selection unit 324 may be realized using a selection transistor. The first selection unit 324 switches between the ON state and the OFF state according to a control signal pSEL output from the selection signal supply unit 337. In a reading operation, the selection transistor turns on and the first amplification unit 315 generates a pixel signal corresponding to the potential of the detection node 320. The pixel signal is output to the signal line 223 shown in FIG. 1B.

Next, examples of potentials used in the circuit are described below. In the following description, it is assumed by way of example that the ground potential (GND) is equal to 0 V. In a first example, a reset potential VS1 supplied to the detection node 320 from the reset transistor 314 and a reset potential VS2 supplied to the node 321 from the reset transistor 331 are set such that VS1=VS2=0 V. Furthermore, other potentials are set as follows: VF1=−1 V; VF2=+1 V; the potential HIGH=+2 V; the potential MID=0 V; and the potential LOW=−2 V. In a second example, potentials are set such that VS1=VS2=+1 V, VF1=0V, VF2=+2 V, the potential HIGH=+3 V, the potential MID=+1 V, and the potential LOW=−1 V. In the second example, the potentials in the first example are all shifted by S (V), and more specifically, S=−1. In a third example, potentials are set such that VS1=VS2=0 V, VF1=−2 V, VF2=+2 V, the potential HIGH=+4 V, the potential MID=+0 V, and the potential LOW=−4 V. The potential values in this third example are equal to the respective values in the first examples multiplied by a factor of T, and more specifically, T=2. Note the value of S described above may be positive or negative, and the value of T may be smaller than 1. The second example and the third example may be combined such that the potentials in the first example are respectively shifted by S (V) and then multiplied by a factor of T. In the three examples described above, the actual values may be properly modified while maintaining the relationships in terms of relative magnitude, potential difference, and relative magnitude of potential difference.

The photoelectric conversion element shown in FIG. 3B is different from the photoelectric conversion element shown in FIG. 3A in that a lowpass filter is additionally provided. By providing the lowpass filter LPF between the detection node 320 and the gate 338 of the first amplification unit 315, it becomes possible to read pixel signals in a stable manner even when a fluctuation occurs in the potential of the detection node 320, and thus it becomes possible to output the signal from the amplifying transistor 315 to the signal line 223 in a stable manner. The lowpass filter LPF may be realized using a known technique. More specifically, for example, the lowpass filter LPF may be realized by connecting a series resistor and a shunt capacitor to the detection node 320.

In FIGS. 3A and 3B, connections may be modified such that control signals to the gate of the transfer transistor 303 and the gate of the transfer transistor 306 may be supplied via separate wirings, and control signals to the gate of the transfer transistor 304 and the gate of the transfer transistor 305 may be supplied via separate wirings. However, by connecting the gate of the transfer transistor 303 and the gate of the transfer transistor 306 to the common transfer node 318, and connecting the gate of the transfer transistor 304 and the gate of the transfer transistor 305 to the common transfer node 319 as with the original circuit configuration shown in FIG. 3A or 3B, it is possible to reduce the wirings for supplying control signals.

Note that the transfer transistor 304 and the transfer transistor 305 may be respectively connected to different nodes, turning-on/off of the transfer transistor 304 and the transfer transistor 305 may be controlled according to separate control signals.

However, it may be advantageous to connect the transfer transistor 304 and the transfer transistor 305 to the common transfer node 319 such that the same control signal TX2 is input to the gate of the transfer transistor 304 and the gate of the transfer transistor 305, because this makes it possible to achieve high timing accuracy in controlling the turning-on/off of the transfer transistor 304 and the transfer transistor 305.

Furthermore, by connecting the charge ejection unit 308 and the charge ejection unit 309 to each other via the node 321 as shown in FIG. 3A or 3B, it is possible to reduce the wirings for supplying power compared with the case in which potentials are separately supplied to the respective charge ejection units from separate power supplies.

Figure 4A:
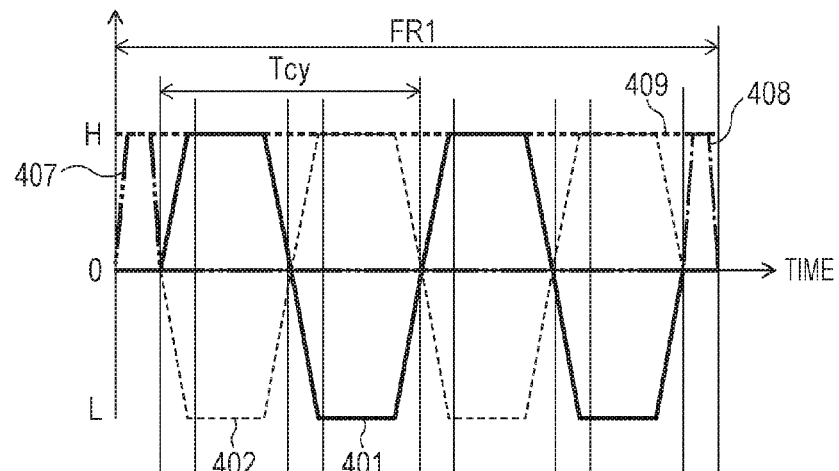
FIG. 4A is a diagram illustrating control signals applied to a photoelectric conversion element.
Figure 4B:
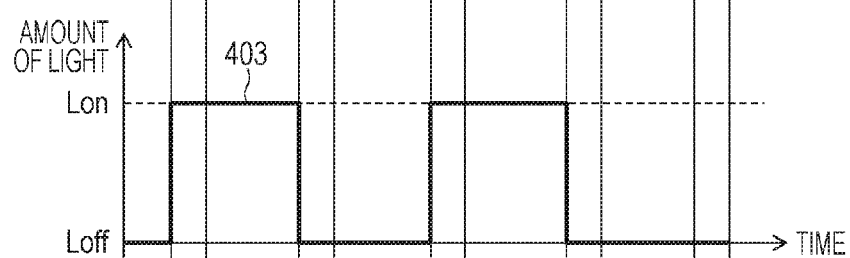
FIG. 4B is a diagram illustrating an output from a light emitting apparatus.
Figure 4C:
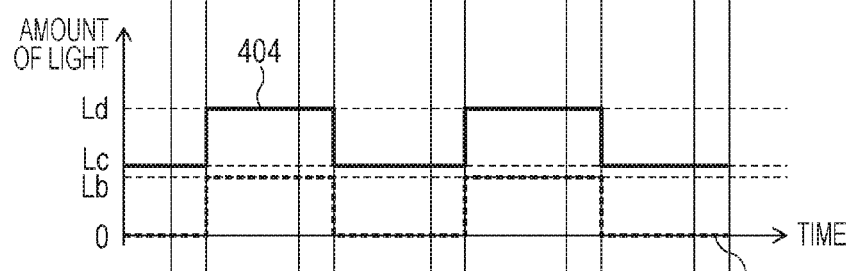
FIG. 4C is a diagram illustrating an amount of light incident on a photoelectric conversion element.
Figure 4D:
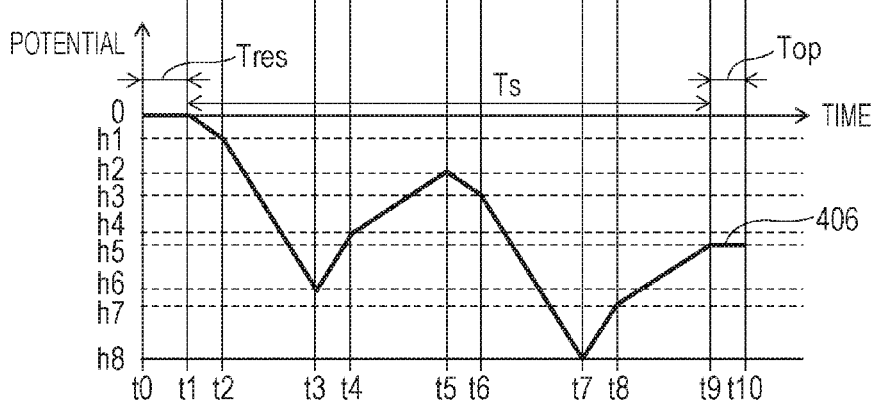
FIG. 4D is a diagram illustrating a potential of a detection node in a photoelectric conversion element.

Next, referring to FIGS. 4A to 4D, a description is given below as to an operation of the photoelectric conversion element 200 and an operation of the light emitting apparatus 102 according to the present embodiment. FIG. 4A shows a control signal pTX1 401 supplied to the transfer node 318 connected to the gates of the transfer transistors 303 and 306 and a control signal pTX2 402 supplied to the transfer node 319 connected to the gates of the transfer transistors 304 and 305 as shown in FIG. 3A or 3B. FIG. 4A also shows a control signal pRES1 407 supplied to the gate of the reset transistor 314, and a control signal pSEL 408 supplied to the gate of the selection transistor 324. FIG. 4B illustrates an output from the light emitting apparatus 102 shown in FIG. 1A. FIG. 4C illustrates an amount of light incident on the photoelectric conversion element 200. FIG. 4D illustrates a potential of the detection node 320 of the amplifying transistor 315.

In the present embodiment, one cycle is a period Tcy (from time t1 to time t5). More specifically, one cycle has a length of, for example, 10 nsec to 100 nsec. The light emitting apparatus 102 periodically turns on and off light emission as illustrated in FIG. 4B. In this specific example, for simplicity of illustration, it is assumed that turning-on/off is repeated twice. However, to achieve practically accurate distance measurement, it may be desirable to repeat turning-on/off 100 or more times for each distance measurement (up to 10000 times in practical point of view).

When the speed of light is denoted by c (m/s) and the distance from the distance measurement apparatus 1 to a target 9 is denoted by d (m), a delay time from a time at which light is emitted to a time at which returned light is sensed is given by 2×d/c (s). Thus measuring the distance is accomplished by detecting a physical quantity corresponding to the delay time from the light emission to the light reception in the period Tcy. The speed of light is equal to $3 \times 10^8$ m/s, that is, 0.3 m/ns, and thus the period Tcy may be set, for example, in a range of 1 ns to 1000 ns, and more preferably in a range of 10 ns to 100 ns. For example, when the distance is 0.3 m, the delay time from emission to reception of light is 2 ns. Therefore, when one cycle Tcy is set to 10 ns, it is possible to detect the distance of 0.3 m by detecting a physical quantity corresponding to the delay time in a period of 10 ns. From the period Tcy and the number of repetitions of turning-on/off of light emission, it can be estimated that the time needed to measure the distance once can be completed within a short period of 1 μs to 10 ms. Therefore, it is possible to read signals from 10 rows to 1000 rows of photoelectric conversion elements 200 (1 frame to 1000 frames) per second.

In the present embodiment, the charge accumulation period Ts is a period from time t1 to time t9 as shown in FIG. 4D. The signal charge accumulated in the charge accumulation period Ts is output in the output period Top from time t9 to time t10. Note that the FD 307 and the FD 310 are reset in a reset period Tres from time t0 to time t1 before the charge accumulation period Ts starts. One frame period FR1 is a period from time t0 to time t10.

In FIG. 4A, a solid line 401 represents a change with time in the control signal pTX1 supplied to the transfer node 318. A broken line 402 represents a change with time in the control signal pTX2 supplied to the transfer node 319. A dash-double-dot line 407 represents a change with time in the control signal pRES1 supplied to the gate of the reset transistor 314. A dotted line 409 represents a change with time in the control signal pRES2 supplied to the gate of the reset transistor 331. A dash-dot line 408 represents a change with time in the control signal pSEL supplied to the gate of the selection transistor 324.

In the following description, for example, an expression "the solid line 401 goes to the H-level" or the solid line 401 is at the H-level" is used to describe that the potential of the transfer node 318 corresponding to the solid line 401 goes to the H-level or is at the H-level. Similar expressions are used also for the broken line 402, the dash-double-dot line 407, the dash-dot line 408, and the dotted line 409. As represented by the solid line 401 and the broken line 402, the potentials of the transfer node 318 and the transfer node 319 are supplied by rectangular waves or sinusoidal waves with the same period but with opposite polarities from the control signal generation unit 203 shown in FIG. 1B.

The 0-level of the solid line 401 and that of the broken line 402 are potentials close to the threshold voltages of the transfer transistors 303, 304, 305, and 306 or potentials that cause these transfer transistors to turn off. When the solid line 401 is at the H-level and the broken line 402 is at the L-level, the transfer transistors 303 and 305 are in the ON state, and the transfer transistors 304 and 306 are in the OFF state. When the solid line 401 is at the L-level, and the broken line 402 is at the H-level, the transfer transistors 303 and 305 are in the OFF state, and the transfer transistors 304 and 306 are in the ON state. Threshold values of transistors may be designed such that the 0-level is higher than the threshold value of each P-type transfer transistor, and the 0-level is lower than the threshold value of each N-type transfer transistor thereby making it possible for any transfer to be in the OFF state at the 0-level. The threshold values may be designed using a known method. For example, the threshold values may be controlled by adjusting the impurity concentration of the channel part of each transistor.

On the other hand, 0-levels for the dash-double-dot line 407, the dash-dot line 408, and the dotted line 409 are set at potentials that allow the reset transistor 314, the reset transistor 331, and the selection transistor 324 to sufficiently turn off. When the dash-double-dot line 407 is at the H-level (in a period from time t0 to time t1), the reset transistor 314 is in the ON state, and the detection node 320 is at the reset potential. When the dash-double-dot line 407 is at the L-level (in a period from time t1 to time t10), the reset transistor 314 is in the OFF state. When the dotted line 409 is at the H-level (in a period from time t0 to time t10), the reset transistor 331 is in the ON state, and the node 321 is at the reset potential. In this situation, if the transfer transistor 304 or 305 turns off, the charge is ejected from the photoelectric conversion unit. Although the dotted line 409 is always at the H-level in the present embodiment, the potential of the dotted line 409 may be controlled in a different manner. For example, the dotted line 409 may be at the same potential as that of the dash-double-dot line 407. In this case, when the dotted line 409 is at the L-level, the reset transistor 331 is in the OFF state.

When the dash-dot line 408 is at the H level (in a period from time t9 to time t10), the selection transistor 324 is in the ON state. In this state, the signal output from the first amplification unit 315 is output to the signal line 223. When the dash-dot line 408 is at the L-level, the selection transistor 324 is in the OFF state.

Note that the threshold values do not necessarily need to have the same value (for example 0 V) for all of the transfer transistors 303, 304, 305, and 306, the reset transistor 314, and the selection transistor 324.

In FIG. 4B, a solid line 403 represents an output from the light emitting apparatus 102 shown in FIG. 1B. When the light emitting apparatus 102 turns light emission on, the output of the light emitting apparatus 102 is at an Lon-level, while when the light emitting apparatus 102 turns light emission off, the output of the light emitting apparatus 102 is at an Loff-level. Note that the light emitting apparatus 102 is turned on/off repeatedly in the same period as that of the solid line 401 shown in FIG. 4A. That is, in the present example, the period in which the solid line 401 is at the positive level is the same period in which the light emitting apparatus 102 is in the ON state.

In FIG. 4C, a solid line 404 represents the amount of light (Lc, Ld) incident on the photoelectric conversion element 200. The amount of light Lc is a level at which environmental light 115 is incident on the photoelectric conversion element 200. The amount of light Ld is a level equal to the sum of the environmental light 115 and reflected light 114 incident on the photoelectric conversion element 200. A dotted line 405 represents the amount of the reflected light 114, which is a part of the total amount of light incident on the photoelectric conversion element 200 and which originates from light emitted from the light emitting apparatus 102 and reflected from the target 106. The amount of light Lb is a level of the reflected light 114. In the example shown in FIG. 4C, the amount of light Lc is larger than the amount of light Lb. However, the amount of light Lc may be smaller than the amount of light Lb. Note that it takes a finite time for the light emitted from the light emitting apparatus 102 to reach the target 106 and further reach the photoelectric conversion apparatus 104 after being reflected from the target 106. Therefore, as can be seen by comparison between FIG. 4B and FIG. 4C, the solid line 404 has a delay from the solid line 403 by an amount corresponding to the distance to the target 106.

In FIG. 4D, a solid line 406 represents a potential of the detection node 320 of the amplifying transistor 315. A signal is amplified based on the potential of the detection node 320, and the resultant amplified signal is output from the amplifying transistor 315. In the example shown in FIG. 4D, the selection transistor 314 is in the ON state in a period from time t9 to time t10 as shown in FIG. 4A, and thus the potential output to the signal line 223 corresponds to the potential of the detection node 320 in the period from time t9 to time t10. In the present example, the reset transistor 331 is always in the ON state, and thus the potential of the node 321, that is, the potential of the charge ejection unit 308 and the charge ejection unit 309, is equal to the potential of the reference power supply 333.

Next, operations associated with FIGS. 4A to 4D are described below.

At time t0, in FIGS. 4A to 4D, the dotted line 402, the solid line 403, the dotted line 405, the solid line 406, and the dash-dot line 408 are at the 0-level, while the solid line 401 and the dash-double-dot line 407 go to the H-level. Furthermore, at time t0, the transfer transistors 304 and 305 and the selection transistors 324 are in the OFF state, while the reset transistor 314 is ON state and the detection node 320 is rest. In this situation, the selection transistor 324 may be turned on. The turning-on of the selection transistor 324 makes it possible to obtain an advantage as described below. That is, noise that occurs when the detection node 320 is reset is output and held by a circuit disposed at a stage following the circuit shown in FIG. 1B. When the signal is output from the amplifying transistor 315 in a period from time t9 to time t10, the noise held in the circuit at the following stage is subtracted from the signal output from the amplifying transistor 315 (by processing performed by a CDS circuit) thereby obtaining the high-accuracy output signal. Furthermore, at time t0, the light emitting apparatus 102 is in the OFF state (no light is emitted) as shown in FIG. 4B, and only the environmental light 115 (amount of light Lc) is incident on the photoelectric conversion element 200 as shown in FIG. 4C. Therefore, at time t0, the potential of the detection node 320 is reset to a reset level by the reset transistor 314 as represented by the solid line 406 in FIG. 4D. In FIG. 4D, the potential of the detection node 320 obtained when the resetting is performed (in the period from time t0 to time t1) is taken as a reference potential (represented as 0 in FIG. 4D), the potential of the detection node 320 at an arbitrary time is represented with respect to the reference potential.

At time t1, as shown in FIG. 4B, the control signal of the light emitting apparatus 102 represented by the solid line 403 changes from Loff to Lon and thus the light emitting apparatus 102 starts light emission. However, at point of time t1, only the environmental light 115 (amount of light Lc) is incident on the photoelectric conversion element 200. Immediately after time t1, the control signal pTX1 represented by the solid line 401 changes from the 0-level to the H-level, while the control signal pTX2 represented by the broken line 402 changes from the 0-level to the L-level. As a result, the transfer transistors 303 and 305 turn on, while the transfer transistors 304 and 306 turn off. Furthermore, at this time t1, the control signal pRES1 represented by the dash-double-dot line 407 goes to the 0-level, while and thus the reset transistor 314 turns off. At time t1, the control signal pSEL1 represented by the dash-dot line 408 remains at the 0-level, and thus the selection transistor 324 remains in the OFF state. Furthermore, as shown in FIG. 4D. the potential of the detection node represented by the solid line 406 starts to change at time t1. Note that the period from time t0 to time t1 is the reset period Tres, and the charge accumulation period Is starts at time t1.

At time t2, as shown in FIG. 4C, the photoelectric conversion element 200 starts to receive light with an amount of Ld. At time t2 thereafter, as shown in FIG. 4D, changing of the potential of the detection node represented by the solid line 406 from the 0-level to the h1-level is completed, and immediately after time t2, changing to the h2-level starts.

Next, at time t3, as shown in FIG. 4B, the control signal to the light emitting apparatus 102 represented by the solid line 403 changes from Lon to Loff, and thus the light emitting apparatus 102 turns off light emission. Note that as shown in FIG. 4A, immediately before time t3, the control signal pTX1 represented by the solid line 401 changes from the H-level to the 0-level, and further changes from the 0-level to the L-level immediately after time t3. On the other hand, the control signal pTX2 represented by the broken line 402 changes from the L-level to the 0-level immediately before time t3 and further changes from the 0-level to the H-level immediately after time t3. As a result, the transfer transistors 303, 304, 305, and 306 all turn off at time t3, then at time t4 the transfer transistors 303 and 305 turn off and the transfer transistors 304 and 306 turn on. As a result, in a period from time t2 to time t3, as shown in FIG. 4D, the potential of the detection node 320 represented by solid line 406 changes from the h1-level to the h6-level. That is, in a period from time t1 to time t3, the potential corresponding to the number of electrons transferred from the photoelectric conversion unit 301 to the FD 307 appears at the detection node 320. In the period from t3 to t4, the potential of each transfer gate may in the middle of change, and the transfer transistor may have not yet reached the full ON state. However, carriers are being accumulated in the photodiode, and the carriers are transferred to the FD when the transfer gate fully turns on at time t4.

At time t4, as shown in FIG. 4C, the light incident on the photoelectric conversion element 200 comes into a state in which only the environmental light 115 (amount of light Lc) is incident. In a period from time t3 to t4, as shown in FIG. 4D, the potential of the detection node represented by the solid line 406 changes from the h6-level to the h4-level. This change occurs because the holes generated in the photoelectric conversion unit 302 are transferred to the FD 310, and the transferring of the holes causes the potential of the detection node 320 to increase.

At time t5, as shown in FIG. 4B, the control signal to the light emitting apparatus 102 represented by the solid line 403 changes from Loff to Lon, and thus the light emitting apparatus 102 turns on light emission. Furthermore, as shown in FIG. 4A, the control signal pTX1 changes from the L-level to the 0-level immediately before time t5 and further changes from the 0-level to the H-level immediately after time t5. On the other hand, the control signal pTX2 represented by the broken line 402 changes from the H-level to the 0-level immediately before time t5 and further changes from the 0-level to the L-level immediately after time t5. As a result, the transfer transistors 303, 304, 305, and 306 all turn off at time t5, and at time t6 thereafter, the transfer transistors 303 and 305 turn on, and the transfer transistors 304 and 306 turn off.

In a period from time t4 to t5, as shown in FIG. 4D, the holes generated in the photoelectric conversion unit 302 are transferred to the FD 310, and thus the potential of the detection node changes from the h4-level to the h2-level.

In this configuration, if the control signal pSEL supplied to the gate of the selection transistor 324 is set such that it is at the H-level at time t5, then a signal obtained at the signal line 223 via the amplifying transistor 315 includes mainly a signal originating from the component of the reflected light 114 but the signal includes a reduced amount of component of the environmental light 115. A period from time t1 to time t5 is one cycle Tcy. If the control signal pSEL supplied to the gate of the selection transistor 324 is not set such that it is at the H-level at the end of the operation of one cycle (at time t5) but set such that the control signal pSEL is at the H-level at the end of a plurality of periods, then it is possible to obtain a signal with a greater amplitude. If the operation of one cycle is repeated a plurality of times as described above, then, ideally, only a charge corresponding to the reflected light 114 is accumulated, and it is possible to obtain a signal with a large amplitude even when the reflected light is weak.

In the example shown in FIG. 4, the operation in the period from t1 to t5 is repeated in a period from t5 to t9. Thus, time t5 corresponds to time t1, time t6 corresponds to time t2, time t7 corresponds to time t3, time t8 corresponds to time t4, and time t9 corresponds to time t5. In FIG. 4D, at time t6, the potential at the detection node represented by the solid line 406 changes from the h2-level to the h3-level. At time t7, the potential thereof changes from the h3-level to the h8-level. Furthermore, the potential thereof changes from the h8-level to the h7-level at time t8, and from the h7-level to the h5 level at time t9. Next, the operation in a period from t9 to t10 is described below in detail.

At time t9, as shown in FIG. 4A, the potential of the control signal pTX2 changes from the H-level to the 0-level, while the control signal pTX1 changes from the L-level to the 0-level, and thus the transfer transistors 303, 304, 305, and 306 all turn off. Furthermore, the control signal pSEL represented by the dash-dot line 408 changes from the 0-level to the H-level, and thus the selection transistor 324 turns on. Then in an output period Top (from time t9 to time t10), the potential of the detection node 320 is output to the signal line 223 via the first amplification unit 315.

At time t10, as shown in FIG. 4A, the control signal pSEL changes from the H-level to the 0-level, Note that in the example shown in FIG. 4A, in a period from time t9 to time t10, the control signals pTX1, pTX2, and pRES1 are maintained at the 0-level as in the period from t0 to t1. In the period from time t9 to time t10, if, as described above, the transfer transistor 303 and the transfer transistor 305 are turned off and the signal is output to the signal line 223 via the amplifying transistor 315, then it is possible to reduce an influence of transferring of charges from the photoelectric conversion unit, and thus it is possible to increase reading accuracy.

Furthermore, in the configuration described above, when a signal charge generated in one photoelectric conversion unit is transferred to an FD, a signal charge generated in another photoelectric conversion unit is ejected to a charge ejection unit, and thus it is possible to suppress leakage charge in photoelectric conversion units.

Figure 5:
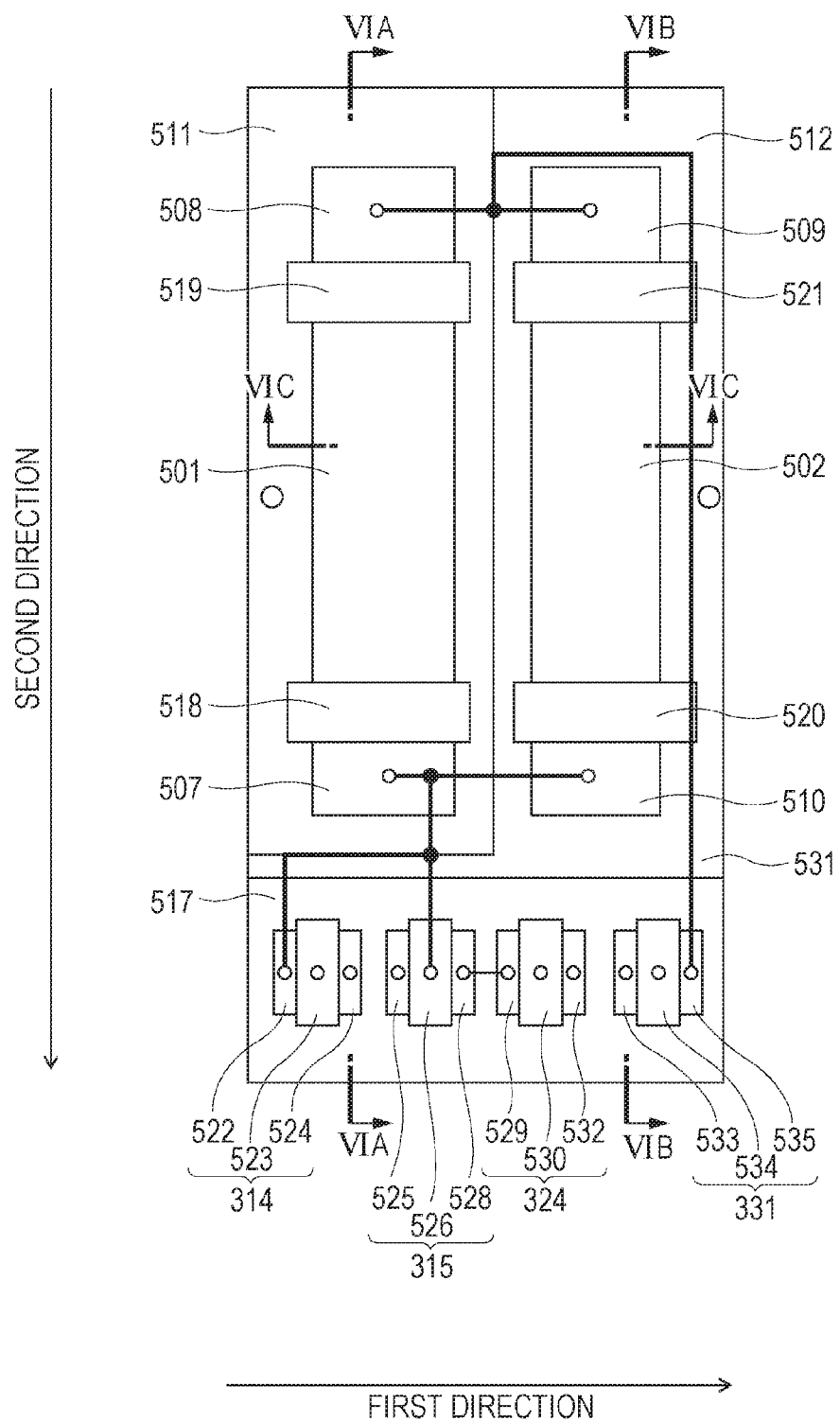
FIG. 5 is a schematic plan view of a photoelectric conversion element.
Figure 6A:
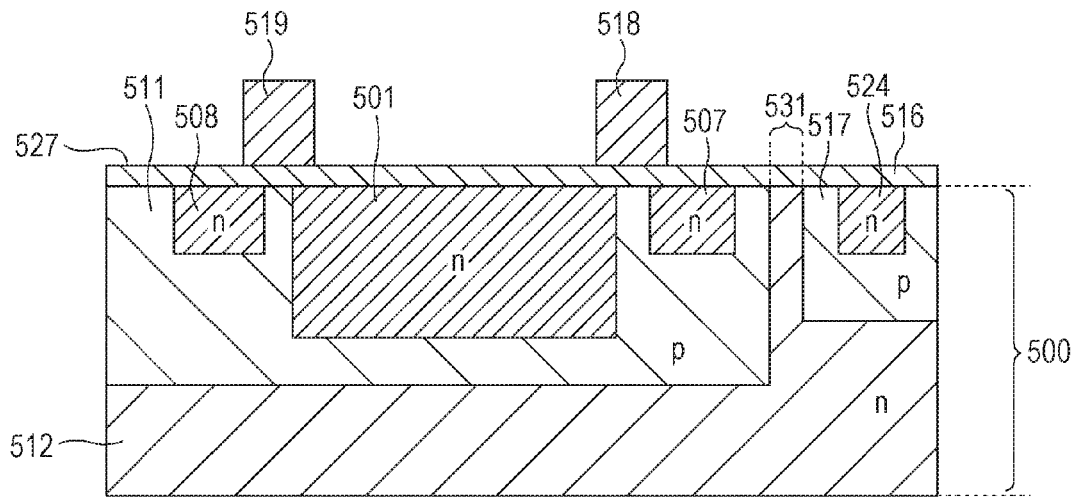
FIGS. 6A to 6C are respectively schematic cross-sectional views of a photoelectric conversion element.
Figure 6B:
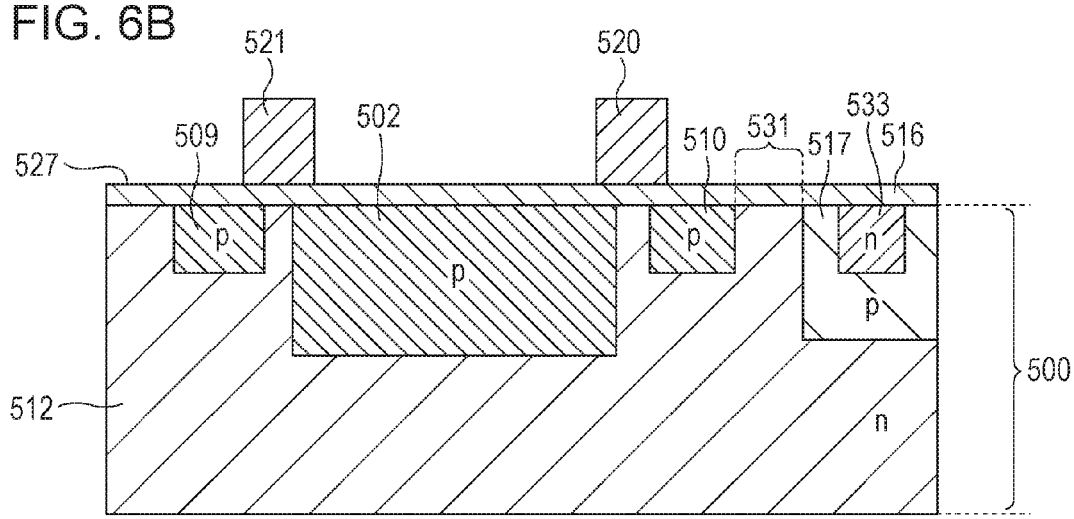
Figure 6C:
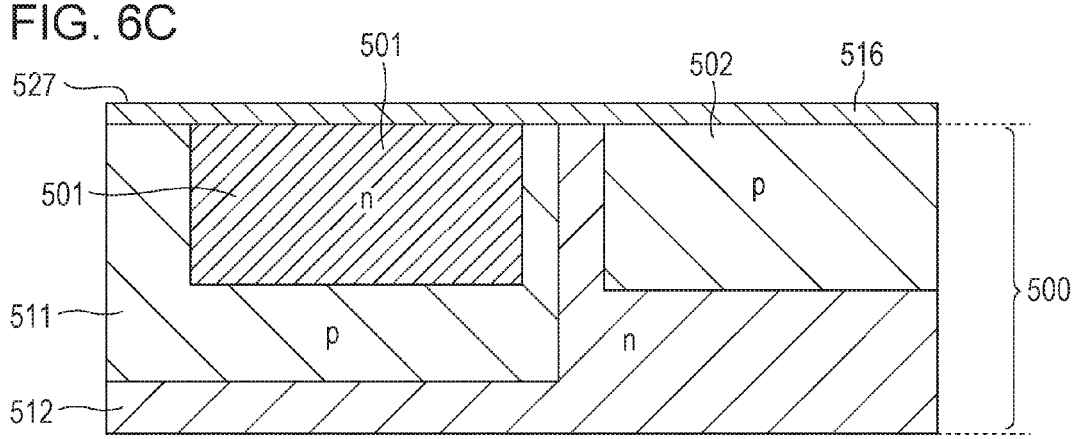

Next, referring to FIG. 5 and FIGS. 6A to 6C, an example of a layout of the photoelectric conversion element 200 according to the present embodiment is described. FIG. 6A illustrates a schematic cross-sectional view taken along a line VIA-VIA in FIG. 5. FIG. 6B illustrates a schematic cross-sectional view taken along a line VIB-VIB in FIG. 5. FIG. 6C illustrates a schematic cross-sectional view taken along a line VIC-VIC in FIG. 5.

FIG. 5 is a schematic plan view of the photoelectric conversion element 200 according to the present embodiment. In FIG. 5, circles represent locations of contact plugs, and thick lines represent wirings disposed in the photoelectric conversion element 200. In FIG. 5, in a semiconductor substrate 500, a second semiconductor region 511 of a second conductivity type (P type) and a first semiconductor region 512 of a first conductivity type (N type) are arranged in a first direction. Furthermore, the region 511 and a third semiconductor region 517 of the second conductivity type are arranged via an element isolation region 531 in a second direction crossing the first direction, and similarly, the region 512 and the third semiconductor region 517 of the second conductivity type are arranged via the element isolation region 531 in the second direction. The second direction crossing the first direction may be perpendicular to the first direction. Each semiconductor region may be formed epitaxially or may be formed by using impurity ion implantation. In the example shown in FIG. 5, by way of example, a semiconductor region of the first conductivity type (N type) is formed to provide the element isolation region 531. However, the region 531 may not be formed, and the region 511 and the region 517 may be constructed in the form of a single continuous semiconductor region of the second conductivity type.

Furthermore, in an area which is surrounded, in plan view, by the P-type semiconductor region 511, an N-type semiconductor region 508 (fourth semiconductor region), a third transfer gate 519, an N-type semiconductor region 501 (fifth semiconductor region), a first transfer gate 518, and an N-type semiconductor region 507 (sixth semiconductor region) are disposed in this order in the second direction. The photoelectric conversion unit 301 shown in FIG. 3A or 3B is formed with the P-type semiconductor region 511 and the N-type semiconductor region 501. A signal charge (electrons) generated in the photoelectric conversion unit 301 is transferred to the N-type semiconductor region 507 forming the first FD 307 via the first transfer gate 518 forming the transfer transistor 303. The N-type semiconductor region 508 forms the charge ejection unit 308 shown in FIG. 3A or 3B, and electrons generated in the photoelectric conversion unit 301 are transferred to the N-type semiconductor region 508 via the third transfer gate 519 forming the transfer transistor 304.

In an area surrounded, in plan view, by the N-type semiconductor region 512, a P-type semiconductor region 509 (seventh semiconductor region), a fourth transfer gate 521, a P-type semiconductor region 502 (eighth semiconductor region), a second transfer gate 520, and a P-type semiconductor region 510 (ninth semiconductor region) are disposed in this order in the second direction. The photoelectric conversion unit 302 shown in FIG. 3A or 3B is formed with the P-type semiconductor region 502 and the N-type semiconductor region 512. A signal charge (holes generated in the photoelectric conversion unit 302 is transferred to the P-type semiconductor region 510 forming the second FD 310 via the second transfer gate 520 forming the transfer transistor 306. The P-type semiconductor region 509 forms the charge ejection unit 309 shown in FIG. 3A or 3B, and holes generated in the photoelectric conversion unit 302 are transferred to the P-type semiconductor region 509 via the fourth transfer gate 521 forming the transfer transistor 305.

In an area surrounded, in plan view, by the P-type semiconductor region 517, the reset transistor 314, the amplifying transistor 315, the selection transistor 324, and the reset transistor 331, shown in FIG. 3A or 3B, are disposed side by side in the first direction. Thus, following elements are disposed in the first direction in the order as described below: the N-type semiconductor region 522; the gate 523 forming the reset transistor; the N-type semiconductor region 524; the N-type semiconductor region 525; the gate 526 forming the amplifying transistor 315; the N-type semiconductor region 528; the N-type semiconductor region 529; the gate 530 forming the selection transistor 324; the N-type semiconductor region 532; the N-type semiconductor region 533; the gate 534 forming the reset transistor 331; and the N-type semiconductor region 535.

The P-type semiconductor region 511 and the N-type semiconductor region 512 are arranged in the first direction along the principal surface of the semiconductor substrate 500. The N-type semiconductor region 512 and the P-type semiconductor region 511 may be in contact with each other as shown in FIG. 5, but they may be separated from each other. In the present example, the N-type semiconductor region 511 and the P-type semiconductor region 512 form a PN junction isolation.

The N-type semiconductor region 501 and the P-type semiconductor region 502 are also arranged in the first direction along the principal surface of the semiconductor substrate 500, but a part of the P-type semiconductor region 511 and a part of N-type semiconductor region 512 are disposed between the N-type semiconductor region 501 and the P-type semiconductor region 502. The N-type semiconductor region 507 and the P-type semiconductor region 510 are connected to each other via a not-shown wiring and via contact plugs electrically connected to the respective semiconductor regions.

Each contact plug is a metal such as tungsten disposed in a contact hole (e.g., an opening) formed in a part of an insulating film (e.g., an interlayer insulating film) disposed on the principal surface of the semiconductor substrate 500. Each contact plug is connected to a circuit unit configured to supply a control signal or the like or to another contact plug via a wiring made of a metal such as aluminum, copper, or the like disposed on the insulating film. Therefore, wirings connected to the contact plugs extend along the principal surface of the semiconductor substrate 500. The insulating film may include a plurality of layers. The wirings do not need to be disposed in a single layer. For example, the insulating film, the wirings, the contact plugs, and the like may be formed as follows: a multilayer insulating film including three layers is formed on the semiconductor substrate 500; a first-layer wiring is formed between a first-layer insulating film and a second-layer insulating film, a second-layer wiring is formed between the second-layer insulating film and a third-layer insulating film, the first-layer wiring and the second-layer wiring are connected to each other via plugs formed in vias (openings) disposed in a part of the second-layer insulating film. Also in this configuration, the wirings extend along the principal surface of the semiconductor substrate 500 (along the first insulating film). Therefore, an insulating film in which contact plugs are formed, an insulating film disposed between wiring layers, an insulating film formed between a wiring layer and the semiconductor substrate 500 are disposed in a one-on-another fashion on the semiconductor substrate 500 in a third direction crossing both the first direction and the second direction. Typically, the first direction, and the second direction, and the third direction are perpendicular to each other. Thus, the contact plugs are formed such that they extend in the third direction through an insulating film. A structure including contact plugs, insulating films, and wirings is referred to as a wiring structure. Note that such a wiring structure is disposed on the semiconductor substrate 500.

In the present example, an electrically conductive material connecting the semiconductor region 507 and the semiconductor region 510 to each other is realized using a wiring and contact plugs. The electrically conductive material connecting the semiconductor region 507 and the semiconductor region 510 is made of a material such as a metallic material, a metallic compound material, polycrystalline silicon, or the like having an electrical conductivity higher than that of the semiconductor substrate 500. The metallic material or the metallic compound material may be used to form wirings and contact plugs, while polycrystalline silicon may be used to form gate electrodes. An example of the metallic compound material is a semiconductor-metallic compound material such as silicide formed on the surface of the semiconductor substrate. One of such materials or a combination of two or more materials may be used to connect the semiconductor region 507 and the semiconductor region 510 to each other. Typically, the semiconductor region 507 and the semiconductor region 510 are connected via an ohmic contact. By employing an electrically conductive material as a material for connecting the semiconductor region 507 and the semiconductor region 510, it is possible to reduce the relaxation time of the potential difference between the semiconductor region 507 and the semiconductor region 510. This makes it possible to stabilize the output of the detection node 320 and thus it is possible to achieve high-accuracy distance measurement.

The N-type semiconductor region 508 and the P-type semiconductor region 509 are connected to each other via a wiring, which is made of an electrically conductive material, and contact plugs formed in the respective semiconductor regions. The N-type semiconductor region 508 and the P-type semiconductor region 509 are supplied with ground potential GND via the reset transistor 331 described above with reference to FIG. 3A or FIG. 3B.

The first transfer gate 518 and the second transfer gate 520 are connected to each other via a not-shown wiring. Via this wiring, the same control signal pTX1 is supplied to the first transfer gate 518 and the second transfer gate 520 from the transfer signal supply unit 329. Thus, the first transfer gate 518 and the second transfer gate 520 are controlled simultaneously. Similarly, the third transfer gate 519 and the fourth transfer gate 521 are connected to each other via a not-shown wiring, and via this wiring the same control signal pTX2 is supplied to the third transfer gate 519 and the fourth transfer gate 521 from the transfer signal supply unit 330. Thus, the third transfer gate 519 and the fourth transfer gate 521 are controlled simultaneously.

The detection node 320 of the amplifying transistor 315 shown in FIG. 3A or 3B includes the N-type semiconductor region 507, the P-type semiconductor region 510, the N-type semiconductor region 522 forming the reset transistor 314, and a wiring, which is made of an electrically conductive material, connecting these elements.

In the example shown in FIG. 5, the amplifying transistor 315, the selection transistor 324, the reset transistor 314, and the reset transistor 331 are disposed in the same active region. However, these may be disposed in different active regions. Some transistors may be disposed in an active region and other transistors may be disposed in a different active region.

As illustrated in FIGS. 6A to 6C, the N-type semiconductor regions 508, 501, and 507 are disposed such that they are included in the P-type semiconductor region 511. The P-type semiconductor regions 509, 502, and 510 are disposed such that they are included in the N-type semiconductor region 512. In other words, the N-type semiconductor regions 508, 501, and 507 are formed inside the P-type semiconductor region 511, and the P-type semiconductor regions 509, 502, and 510 are formed inside the N-type semiconductor region 512. The N-type semiconductor regions 522, 524, 525, 528, 529, 532, 533, and 535 are disposed such that they are included in the P-type semiconductor region 517. These semiconductor regions are formed in the semiconductor substrate 500. The first transfer gate 518, the second transfer gate 520, the third transfer gate 519, and the fourth transfer gate 521 are disposed on the principal surface 527 of the semiconductor substrate 500. More specifically, because the insulating film 516 is formed on the surface of the semiconductor substrate 500, the principal surface 527 is defined as the surface of the semiconductor substrate 500 including the insulating film (gate insulating film) 516. As shown in FIG. 6A, the first transfer gate 518 (third transfer gate 519) is disposed such that a part of it is located on the N-type semiconductor region 501 via the gate insulating film 516 and a part of it is located on the N-type semiconductor region 507 (N-type semiconductor region 508) via the gate insulating film 516. In other words, the first transfer gate 518 is disposed directly on the gate insulating film 516 which in turn is disposed on the N-type semiconductor region 501 and the N-type semiconductor region 507. In this manner, at least a part of the first transfer gate 518 is disposed above the region 511 between the regions 501 and 507. Similarly, the second transfer gate 520 (fourth transfer gate 521) is disposed such that a part of it is located on the P-type semiconductor region 502 via the gate insulating film 516 and a part of it is located on the P-type semiconductor region 510 (P-type semiconductor region 509) via the gate insulating film 516.

Note that the P-type semiconductor region 511 and the P-type semiconductor region 517 are isolated from each other by disposing an N-type semiconductor region 531 between the P-type semiconductor region 511 and the P-type semiconductor region 517. However, the N-type semiconductor region 531 may not be provided, and the P-type semiconductor region 511 and the P-type semiconductor region 517 may be combined into a single P-type semiconductor region. Furthermore, instead of providing the N-type semiconductor region 531 to achieve a PN isolation, an insulator such as silicon dioxide or the like may be provided to isolate the P-type semiconductor region 511 and the P-type semiconductor region 517 from each other.

In FIG. 6A, the photoelectric conversion unit 301 shown in FIG. 3A or 3B is realized by a PN junction formed by the N-type semiconductor region 501 and the P-type semiconductor region 511, where the N-type semiconductor region 501 forms the cathode 325 shown in FIG. 3A or 3B and the P-type semiconductor region 511 forms the anode 326 shown in FIG. 3A or 3B. The N-type semiconductor region 501 may be set to have an impurity concentration low enough to allow the built-in potential to provide depletion. In this configuration, of electron-hole pairs generated in the photoelectric conversion unit 301, electrons generated as a signal charge are not allowed to easily accumulate in the photoelectric conversion unit 301 and thus it is possible to achieve an increase in transfer efficiency of electrons from the photoelectric conversion unit 301 to the semiconductor region 507. Furthermore, it is always possible to fully transfer electrons generated by light to the semiconductor region 507, and thus it is possible to reduce noise caused by a low transfer efficiency. Note that holes which are not used as signal charges are ejected via the P-type semiconductor region 511.

The photoelectric conversion unit 302 shown in FIG. 3A or 3B is realized by a PN junction formed by the P-type semiconductor region 502 and the N-type semiconductor region 512, where the P-type semiconductor region 502 forms the cathode 328 shown in FIG. 3A or 3B and the N-type semiconductor region 512 forms the anode 327 shown in FIG. 3A or 3B. The P-type semiconductor region 502 may be set to have an impurity concentration low enough to allow the built-in potential to provide depletion. In this configuration, of electron-hole pairs generated in the photoelectric conversion unit 302, holes generated as a signal charge are not allowed to easily accumulate in the photoelectric conversion unit 302 and thus it is possible to achieve an increase in transfer efficiency of holes from the photoelectric conversion unit 302 to the semiconductor region 510. Furthermore, it is always possible to fully transfer holes generated by light to the semiconductor region 510, and thus it is possible to reduce noise caused by a low transfer efficiency. Note that electrons which are not used as signal charges are ejected via the N-type semiconductor region 512.

In the present example, the first transfer gate (first gate electrode) 518 and the second transfer gate (second gate electrode) 520 are constructed as different gates. Charging and discharging occurs at a gate electrode each time the gate electrode is driven. That is a current depending on MOS capacitance flows each time switching is performed. In a case where high-speed driving is performed, the smaller the gate electrode of the transistor, the smaller the MOS capacitance, and thus the smaller the current, and the smaller the heating and thus the smaller the power consumption. Therefore, by forming the first transfer gate 518 and the second transfer gate 520 separately, the size of the gate electrode may be reduced significantly. However, the first transfer gate 518 and the second transfer gate 520 may be combined into the form of a single gate. This results in a reduction in wirings, which in turn results in a reduction in wiring capacitance and resistance. Thus it is possible to increase accuracy in controlling the complementary operation of the transfer transistors 303 and 306. Furthermore, the reduction in wirings allows an increase in aperture ratio, which results in an increase in sensitivity. The third transfer gate 519 and the fourth transfer gate 521 may also be formed in the above-described manner.

The P-type semiconductor region 511 is supplied with the reference potential VF1 from the reference potential supply unit 311. The N-type semiconductor region 512 is supplied with the reference potential VF2 from the reference potential supply unit 312. In the present embodiment, for example, −2 V is supplied as the reference potential VF1 to the P-type semiconductor region 511, and +2 V is supplied as the reference potential VF2 to the N-type semiconductor region 512. The N-type semiconductor region 508 and the P-type semiconductor region 509 serving as charge ejection units are supplied with 0 V via the reset transistor 331. That is, the potential of the node 321 (the charge ejection units 308 and 309) shown in FIG. 3A or 3B is reset to 0 V via the reset transistor 331. Furthermore, as represented by the dash-double-dot line in FIG. 4A, the reset transistor 314 turns off after it has been in the ON state for a particular period. In the present embodiment, the N-type semiconductor region 507 and the P-type semiconductor region 510 are reset to 0 V. That is, the potential of the detection node 320 shown in FIG. 3A or 3B is reset to 0 V via the reset transistor 314. In the case where the P-type semiconductor region 511 is supplied with −2 V, the potential of the N-type semiconductor region 501 comes to be equal to about −1 V. When the +2V is supplied to the N-type semiconductor region 512, the potential of the P-type semiconductor region 502 comes to be equal to about +1 V. That is, a difference of about 1 V in potential occurs between the N-type semiconductor region 501 and the N-type semiconductor region 507 and between the N-type semiconductor region 501 and the N-type semiconductor region 508. Therefore, when the transfer gate 518 is in the ON state and the transfer gate 519 is in the OFF state, electrons are quickly transferred from the N-type semiconductor region 501 to the N-type semiconductor region 507. On the other hand, when the transfer gate 518 is in the OFF state and the transfer gate 519 is in the ON state, electrons are quickly transferred from the N-type semiconductor region 501 to the N-type semiconductor region 508. A difference of about 1 V in potential also occurs between the P-type semiconductor region 502 and the P-type semiconductor region 509 and between the P-type semiconductor region 502 and the P-type semiconductor region 510. Therefore when the transfer gate 520 is in the ON state and the transfer gate 521 is in the OFF state, holes are quickly transferred from the P-type semiconductor region 502 to the P-type semiconductor region 510. On the other hand, when the transfer gate 518 is in the OFF state and the transfer gate 519 in the ON state, holes are quickly transferred from the P-type semiconductor region 502 to the P-type semiconductor region 509.

According to the present embodiment, as described above, when a signal charge generated in one photoelectric conversion unit is transferred to an FD, a signal charge generated in another photoelectric conversion unit is ejected to a charge ejection unit, and thus it is possible to suppress leakage charge in photoelectric conversion units. Furthermore, for example, by supplying a positive potential to the N-type semiconductor region 512 and a negative potential to the P-type semiconductor region 511, it is possible to set the reference potential VF2 to be higher than the reference potential VF1 to make it possible to efficiently transfer charges, and thus it is possible to achieve a high-speed operation and high-accuracy signal acquisition.

Second Embodiment

A second embodiment is described below while focusing on differences from the first embodiment described above. In the first embodiment, transferring of electrons from the N-type semiconductor region 501 forming the photoelectric conversion unit 301 to the N-type semiconductor region 508 forming the charge ejection unit 308 is controlled by the transfer gate 519. In contrast, in the second embodiment, transferring of electrons from the N-type semiconductor region 501 to the N-type semiconductor region 508 is controlled by controlling potentials such that the potential difference between the N-type semiconductor region 501 and the N-type semiconductor region 508 has a particular relationship with the potential difference between the N-type semiconductor region 501 and the N-type semiconductor region 507 forming the FD 307.

Similarly, in the first embodiment described above, transferring of holes from the P-type semiconductor region 502 forming the photoelectric conversion unit 302 to the P-type semiconductor region 509 forming the charge ejection unit 309 is controlled by the transfer gate 521. In contrast, in the second embodiment, transferring of holes from the P-type semiconductor region 502 to the P-type semiconductor region 510 is controlled by controlling potentials such that the potential difference between the P-type semiconductor region 502 and the P-type semiconductor region 509 and the potential difference between the P-type semiconductor region 502 and the P-type semiconductor region 510 forming the FD 310 satisfy a particular relationship.

Figure 7:
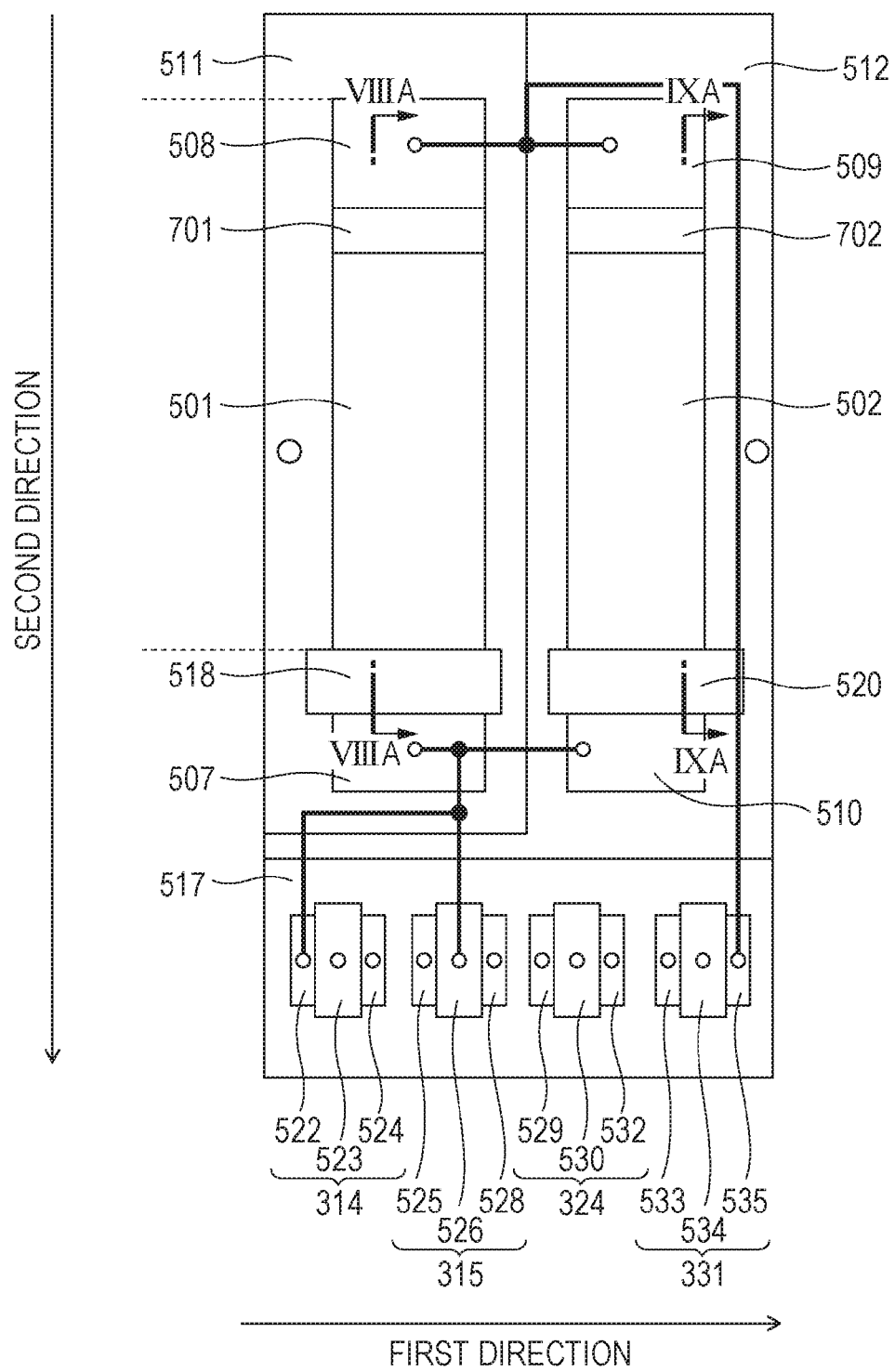
FIG. 7 is a schematic plan view of a photoelectric conversion element.

FIG. 7 is a schematic plan view of the photoelectric conversion element according to the second embodiment. In FIG. 7, elements similar to those in FIG. 5 are denoted by similar reference numerals. The following description will focus on differences from FIG. 5.

As illustrated in FIG. 7, the N-type semiconductor region 508, the P-type semiconductor region 701, the N-type semiconductor region 501, the first transfer gate 518, and the N-type semiconductor region 507 are disposed in this order in the second direction. Furthermore, the P-type semiconductor region 509, the N-type semiconductor region 702, the P-type semiconductor region 502, the second transfer gate 520, and the P-type semiconductor region 510 are disposed in this order in the second direction.

The P-type semiconductor region 701 is disposed between the N-type semiconductor region 501 and the N-type semiconductor region 508. The N-type semiconductor region 702 is disposed between the P-type semiconductor region 502 and the P-type semiconductor region 509.

Next, referring to FIGS. 8A to 8C, a schematic cross-sectional view taken along a line VIIIA-VIIIA in FIG. 7 and a potential profile to electrons are described below.

Figure 8A:
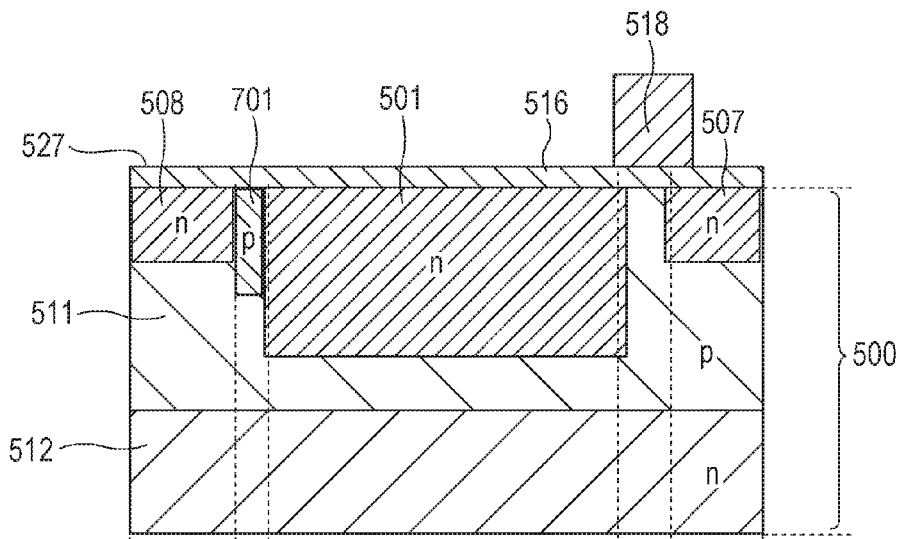
FIG. 8A is a schematic cross-sectional view of a photoelectric conversion element.

In FIG. 8A, the third transfer gate 519 shown in FIG. 5 and FIGS. 6A to 6C is not disposed, but instead, the P-type semiconductor region 701 is disposed between the N-type semiconductor region 501 and the N-type semiconductor region 508. Note that the P-type semiconductor region 701 is a region satisfying the potential relationship shown in FIGS. 8B and 8C. More specifically, for example, the region satisfying the potential relationship is obtained when the P-type semiconductor region 701 has an impurity concentration lower than the impurity concentration of the P-type semiconductor region 511. Note that the region satisfying the potential relationship is not limited to this example.

Figure 8B:
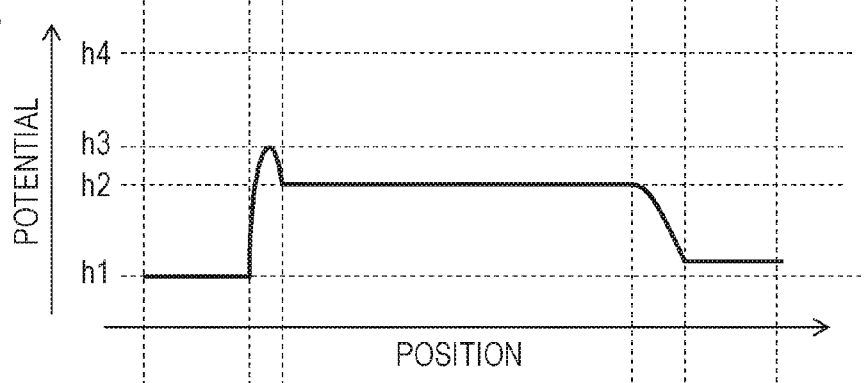
FIGS. 8B and 8C are diagrams illustrating potential profiles.

FIG. 8B shows a potential profile to electrons in a period in which electrons are transferred from the N-type semiconductor region 501 to the FD 307. In FIG. 8B, the N-type semiconductor region 501 has a potential height of h2, the N-type semiconductor region 508 supplied with the ground potential has a potential height of h1, and the N-type semiconductor region 507 has a potential height in a range of h1 to h2. A region between the N-type semiconductor region 501 and the N-type semiconductor region 507 has a potential height from h1 to h2 in the period in which electrons are transferred from the N-type semiconductor region 501 to the N-type semiconductor region 507. On the other hand, a region between the N-type semiconductor region 501 and the N-type semiconductor region 508 has a potential height of h3. That is, the height of potential to the electron between the N-type semiconductor region 501 and the N-type semiconductor region 508 is higher than the height of potential to the electron between the N-type semiconductor region 501 and the N-type semiconductor region 507.

Figure 8C:
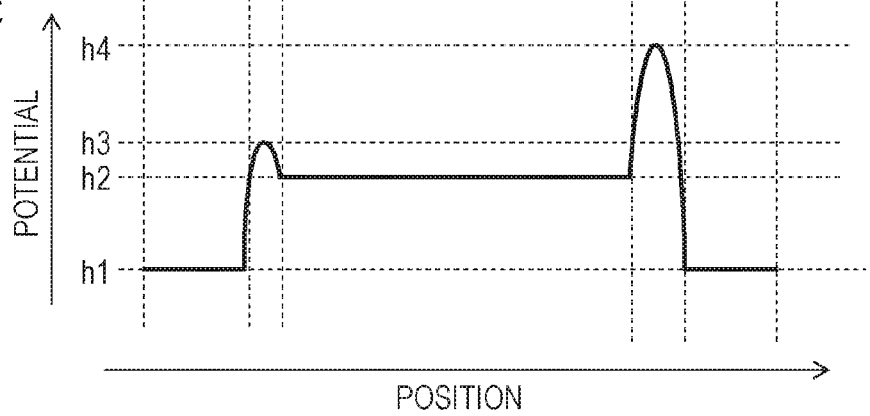

FIG. 8C illustrates a potential profile to electrons in a period in which no electrons are transferred from the N-type semiconductor region 501 to the N-type semiconductor region 507 (that is, in the period in which electrons are transferred to the N-type semiconductor region 508 forming the charge ejection unit 308). In the example shown in FIG. 8C, the potential profile is different from that shown in FIG. 8B in that the region between the N-type semiconductor region 501 and the N-type semiconductor region 507 has a potential height of h4.

That is, the potential height to electros in the region between the N-type semiconductor region 501 and the N-type semiconductor region 508 is lower than the potential height to electrons in the region between the N-type semiconductor region 501 and the N-type semiconductor region 507.

This configuration makes it possible to eject electrons generated in the N-type semiconductor region 501 forming the photoelectric conversion unit 301 to the N-type semiconductor region 508 forming the charge ejection unit 308 in the period in which no electrons are transferred from the N-type semiconductor region 501 to the N-type semiconductor region 507.

Next, referring to FIGS. 9A to 9C, a schematic cross-sectional view taken along a line IXA-IXA in FIG. 7 and a potential profile to holes are described below.

Figure 9A:
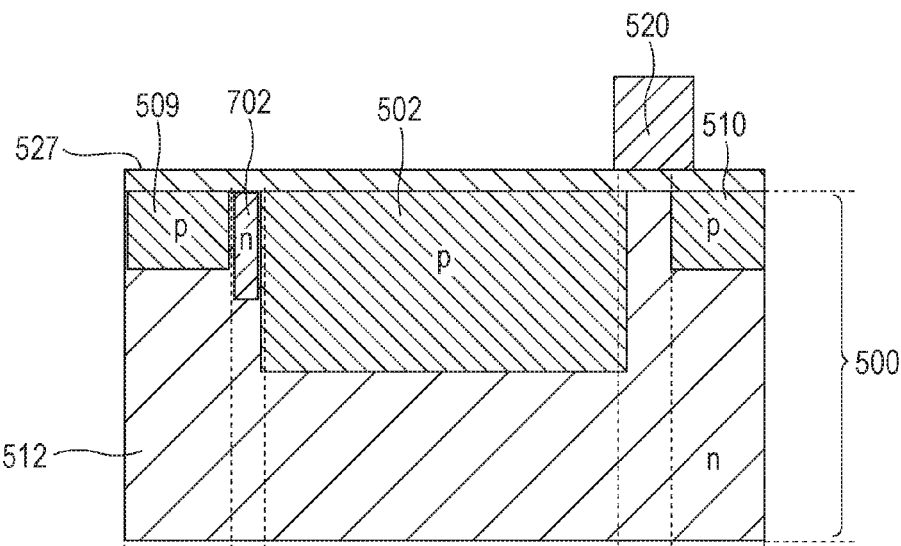
FIG. 9A is a schematic cross-sectional view of a photoelectric conversion element.

In FIG. 9A, the fourth transfer gate 521 shown in FIG. 7 is not disposed, and the N-type semiconductor region 702 is disposed between the P-type semiconductor region 502 and the P-type semiconductor region 509. Note that the N-type semiconductor region 702 is a region satisfying the potential relationship shown in FIGS. 9B and 9C. More specifically, for example, the region satisfying the potential relationship is obtained when the N-type semiconductor region 702 has an impurity concentration lower than the impurity concentration of the N-type semiconductor region 512. Note that the region satisfying the potential relationship is not limited to this example.

Figure 9B:
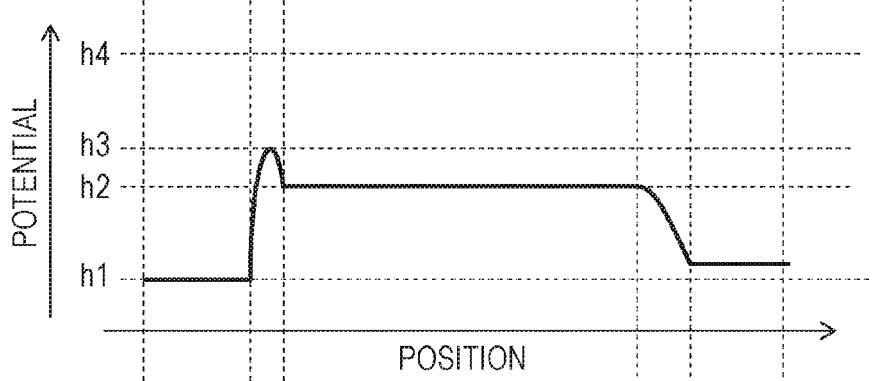
FIGS. 9B and 9C are diagrams illustrating potential profiles.

FIG. 9B shows a potential profile to holes in a period in which holes are transferred from the P-type semiconductor region 502 to the P-type semiconductor region 510. In FIG. 9B, the P-type semiconductor region 502 has a potential height of h2, the P-type semiconductor region 509 supplied with the ground potential has a potential height of h1, and the P-type semiconductor region 510 has a potential height in a range of h1 to h2. A region between the P-type semiconductor region 502 and the P-type semiconductor region 510 has a potential height from h1 to h2, and a region between the P-type semiconductor region 502 and the P-type semiconductor region 509 has a potential height of h3. That is, the potential height to holes in the region between the P-type semiconductor region 502 and the P-type semiconductor region 510 is lower than the height of potential to holes in the region between the P-type semiconductor region 502 and the P-type semiconductor region 509.

Figure 9C:
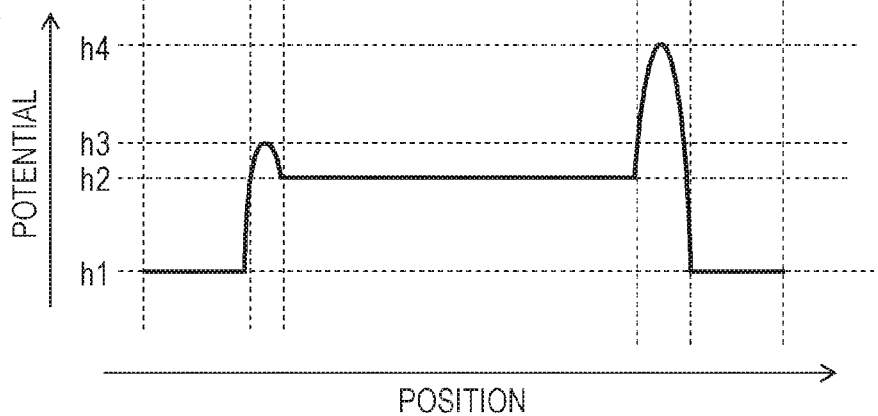

FIG. 9C shows a potential profile to holes in a period in which holes are not transferred from the P-type semiconductor region 502 to the P-type semiconductor region 510.

The potential profile shown in FIG. 9C is different from that shown in FIG. 9B in that the region between the P-type semiconductor region 502 and the P-type semiconductor region 510 has a potential height of h4.

That is, the potential height to holes in the region between the P-type semiconductor region 502 and the P-type semiconductor region 509 is lower than the potential height to holes in the region between the P-type semiconductor region 502 and the P-type semiconductor region 510.

This configuration makes it possible to eject holes generated in the P-type semiconductor region 502 forming the photoelectric conversion unit 302 to the P-type semiconductor region 509 forming the charge ejection unit 309 in the period in which no holes are transferred from the P-type semiconductor region 502 to the P-type semiconductor region 510. In the present embodiment, it is possible to eject unnecessary charges to the charge ejection unit without having to provide the third transfer gate 519 and the fourth transfer gate 521, and thus simplification in configuration compared to the first embodiment is achieved.

Third Embodiment

A third embodiment is described below while focusing on differences from the first embodiment described above. In the first embodiment described above, of charge pairs generated in the photoelectric conversion unit 301, electrons generated as a signal charge are transferred to the FD 307 and the charge ejection unit 308. On the other hand, of charge pairs generated in the photoelectric conversion unit 302, holes generated as a signal charge are transferred to the FD 310 and the charge ejection unit 309. The electrons transferred to the charge ejection unit 308 and the holes transferred to the charge ejection unit 309 are ejected.

Figure 10:
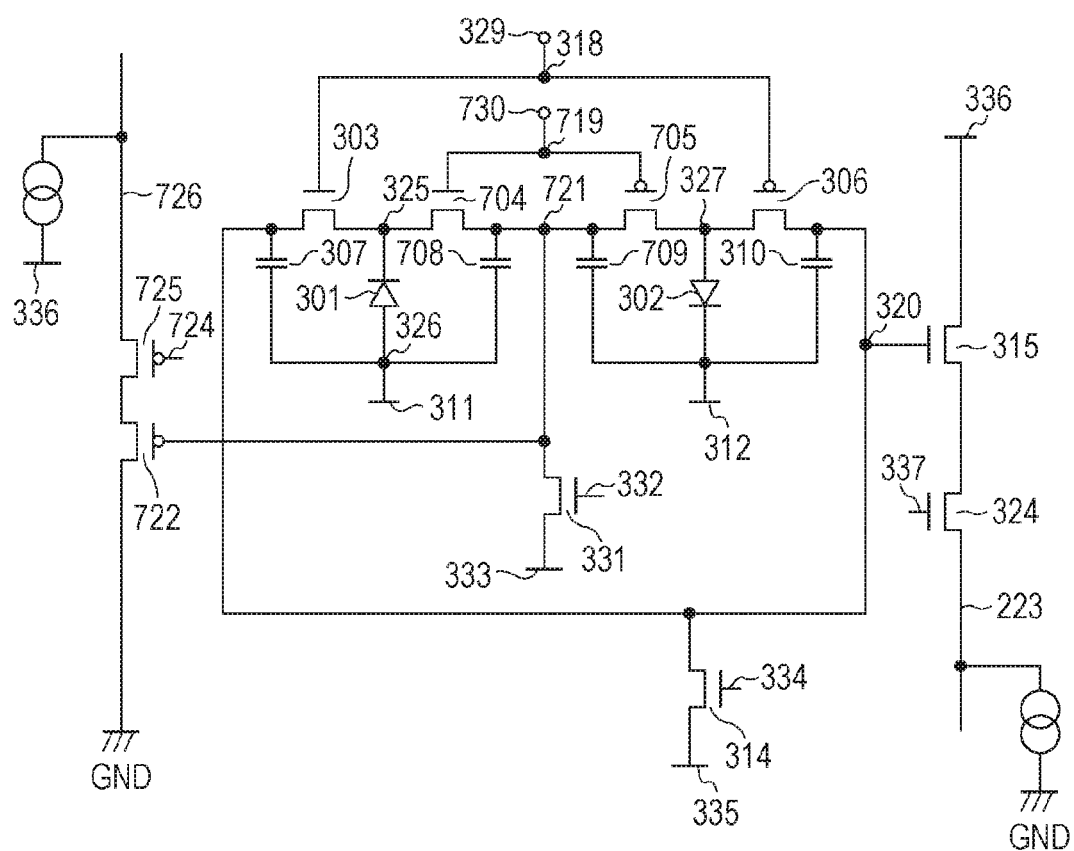
FIG. 10 is a diagram illustrating an equivalent circuit of a photoelectric conversion element.

In contrast, in the third embodiment, as illustrated in FIG. 10, of charge pairs generated in the photoelectric conversion unit 302, electrons generated as a signal charge are transferred to the FD 307 and the FD 708. Of charge pairs generated in the photoelectric conversion unit 302, holes generated as a signal charge are transferred to the FD 310 and the FD 709. The FD 708 and the FD 709 form a part of the detection node 721 of the amplifying transistor 722, and the second amplification unit (amplifying transistor) 722 outputs a signal amplified based on the detection node 721. This makes it possible to increase the magnitude of the obtained signal. In the apparatus according to the third embodiment, the charge ejection unit according to the first embodiment is replaced with the FD, and furthermore, to output the signal based on the charge transferred to the FD disposed instead of the charge ejection unit, structures similar to those of the amplification unit 315, the selection unit 324, the signal line 223, and the constant current source 430 according to the first embodiment are provided.

FIG. 10 illustrates an example of an equivalent circuit of the photoelectric conversion element 200 according to the third embodiment. The description given below with reference to FIG. 10 will focus on differences from FIGS. 3A and 3B. Although no lowpass filter LPF is disposed in the present embodiment, a lowpass filter LPF may be disposed at least between the gate of the amplifying transistor 315 and the detection node 320 or between the gate of the amplifying transistor 722 and the detection node 721.

To the FD 708 (third FD), electrons generated as a signal charge in the photoelectric conversion unit 301 are transferred. To the FD 709 (fourth FD), holes generated as a signal charge in the photoelectric conversion unit 302 are transferred. The FD 708 and the FD 709 respectively have similar structures to the structures of the FD 307 and the FD 310, and more specifically, each is realized in the form of a PN junction type diode such that the FD 708 is an N-type semiconductor region of the diode while the FD 709 is a P-type semiconductor region of the diode. In the case of the FD 708, electrons generated as the signal charge are transferred to the N-type semiconductor region, while in the case of the FD 709, holes generated as the signal charge are transferred to the P-type semiconductor region.

The transfer transistor 704 and the transfer transistor 705 respectively have the same structure as the structures of the transfer transistor 304 and the transfer transistor 305 according to the first embodiment. The gate electrode of the transfer transistor 704 and the gate electrode of the transfer transistor 705 are connected together to the transfer node 719, and this transfer node 719 is connected to the transfer signal supply unit 730 such that the control signal pTX2 is input to the transfer node 719 from the transfer signal supply unit 730 as with the first embodiment.

The FD 708 and the FD 709 are connected via an electrically conductive material such that they are at the same potential. The FD 708, the FD 709, the electrically conductive material, and the source of the reset transistor 331 form the detection node 721 of the second amplification unit 722 described below.

The detection node 721 is connected to the second amplification unit (amplifying transistor) 722 such that the signal based on the potential at the detection node 320 is amplified and output. The drain of the first amplification unit 722 is connected to the power supply unit 336 such that the power supply voltage VDD is supplied thereto from the power supply unit 336. The second amplification unit 722 forms together with a current source a source follower circuit.

The gate of the amplifying transistor 722 is connected to the detection node 721 such that the amplifying transistor 722 amplifies the signal based on the potential of the detection node 721 and outputs the resultant amplified signal to a signal line 724 via a second selection unit (selection transistor) 725.

Figure 11:
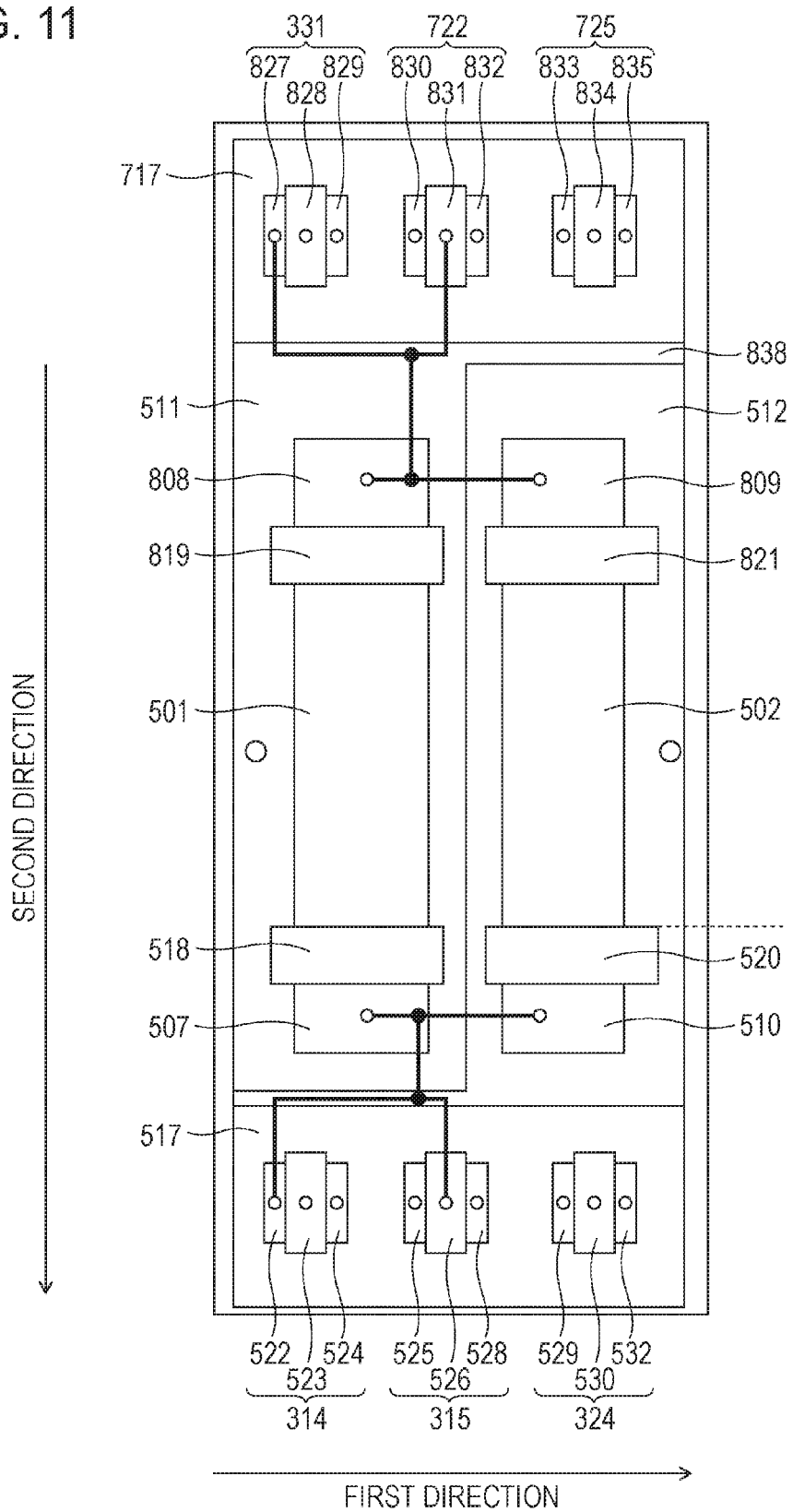
FIG. 11 is a schematic plan view of a photoelectric conversion element.

FIG. 11 is a schematic plan view of the photoelectric conversion element 200 according to the present embodiment. A configuration shown in FIG. 11 is different from that shown in FIG. 5 as described below.

The configuration according to the third embodiment further includes elements in addition to the elements of the configuration shown in FIG. 5 as described below. A P-type semiconductor region 511 and an N-type semiconductor region 512 are arranged in a first direction between an N-type semiconductor region 717 and a P-type semiconductor region 517 which are arranged in a second direction. In the example shown in FIG. 11, a part of the P-type semiconductor region 511 extends between the N-type semiconductor region 512 and the N-type semiconductor region 717 so as to provide a P-type semiconductor region 838 serving as an element isolation region. However, instead of providing the P-type semiconductor region 838, the N-type semiconductor region 512 and the N-type semiconductor region 717 may extend such that they are directly connected and they form a single region.

In FIG. 11, in the N-type semiconductor region 717, the second reset transistor 331, the second amplifying transistor 722, and the second selection transistor 725, described above with reference to FIG. 10, are disposed such that they are arranged side by side in the first direction. More specifically, a P-type semiconductor region 827, a gate 828 forming a reset transistor, a P-type semiconductor region 829, a P-type semiconductor region 830, a gate 831 forming an amplifying transistor, a P-type semiconductor region 832, a P-type semiconductor region 833, a gate 834 forming a selection transistor, and a P-type semiconductor region 835 are disposed in this order in the first direction.

An N-type semiconductor region 808 (fourth semiconductor region) is a region forming the FD 708. A P-type semiconductor region 809 (seventh semiconductor region) is a region forming the FD 709.

The detection node 721 of the second amplification unit (second amplifying transistor) 722 includes the P-type semiconductor region 809 forming the FD 709, the N-type semiconductor region 808 forming the FD 708, the P-type semiconductor region 827 forming the source of the reset transistor 331, and an electrically conductive material connecting the above elements together.

Figure 12:
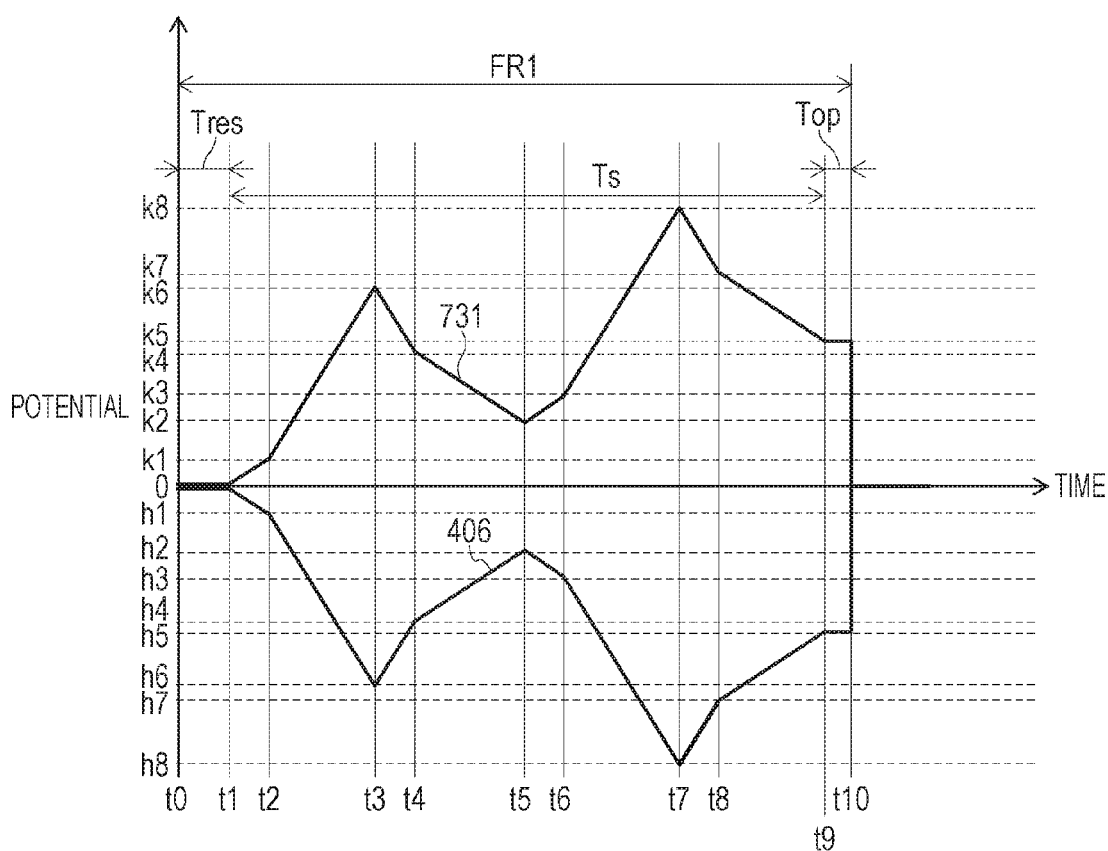
FIG. 12 is a diagram illustrating outputs of a photoelectric conversion element.

Referring to FIG. 12, an operation of the photoelectric conversion element 200 according to the third embodiment is described below. Note that the following description focuses on differences from FIG. 4.

FIG. 12 illustrates a potential of a detection node of a photoelectric conversion element according to the present embodiment. Control signal given to the photoelectric conversion element or the light emitting apparatus 102 are similar to those described above with reference to FIGS. 4A, 4B and 4C, and thus a description thereof is not given. In the example described above with reference to FIG. 4D, electrons and holes generated in the photoelectric conversion unit 301 and the photoelectric conversion unit 302 are not all output, and more specifically, those transferred to the charge ejection unit 308 and the charge ejection unit 309 do not contribute to output. In contrast, in the photoelectric conversion element 200 according to the third embodiment, the charge ejection unit 308 and the charge ejection unit 309 are respectively replaced with the FD 708 and the FD 709, and electrons and holes transferred to the FD 708 and the FD 709 are also used to generate an output signal.

In FIG. 12, the first amplifying transistor 315 outputs a signal based on the potential of the detection node 320 represented by a solid line 406, while the second amplifying transistor 722 outputs a signal based on the potential of the detection node 721 represented by a solid line 731. The second amplifying transistor and the second selection transistor 725 are both realized using a p-type MOS transistor, and thus the signal based on the potential at the detection node 721 represented by the solid line 731 is identical to a signal obtained by inverting, with reference to the 0-level, the signal based on the potential at the detection node 320 represented by the solid line 406. Thus, in the signal processing unit 205 configured to process signals respectively output from the first amplifying transistors and the second amplifying transistor, the difference between the output from the first amplifying transistor and the output from the second amplifying transistor can provide an enlarged output signal.

EXAMPLES OF APPLICATIONS

Examples of applications of the information processing system SYS are described below with reference to FIG. 1A. In a first example, the information processing system SYS is applied to a camera including an image capturing apparatus. First, a distance measurement command signal is sent to the information processing apparatus 107 from a shutter control mechanism or a focus control mechanism (for example, a shutter button, a focus button, or the like) serving as the input apparatus 109. The information processing apparatus 107 operates the distance detection sensor 101. The distance detection sensor 101 outputs a signal including distance information indicating the distance to an object given as the target 106. The output signal is processed by the information processing apparatus 107 to generate a control signal to control a lens, an aperture, a shutter and/or other control mechanism to optimize the condition of capturing an image of a target 106. The resultant control signal is output to the driving apparatus 110. The driving apparatus 110 drives the control mechanism described above according to the control signal. If an image capture command signal is sent from the input apparatus 109 to the information processing apparatus 107, the information processing apparatus 107 commands the image capturing apparatus 108 to capture an image. The information processing apparatus 107 displays, on the display apparatus 111, an image acquired from the image capturing apparatus 108. The information processing apparatus 107 may add distance information to the displayed image. The communication apparatus 112 communicates with a storage apparatus or a network to store the image in the storage apparatus or a storage on the network.

In a second example, the information processing system SYS is applied to a video information processing system configured to provide a combined virtual reality to a user. When the information processing apparatus 107 operates the distance detection sensor 101 and the image capturing apparatus 108, the image capturing apparatus 108 captures an image of an object given as the target 106, and outputs a real-world image. On the other hand, the distance detection sensor 101 outputs a signal including distance information representing the distance to the object given as the target 106. Based on this signal, the information processing apparatus 107 combines a virtual image generated by computer graphics or the like and the real-world image obtained from the image captured by the image capturing apparatus 108 based on the distance information, thereby generating a mixed image. The information processing apparatus 107 displays the mixed image on a head-mounted display or the like functioning as the display apparatus 111.

In a third example, the information processing system SYS is applied to a vehicle (such as a car, a train, or the like) including a driving apparatus configured to drive wheels or the like. When an apparatus (a start button or the like) generates an engine start signal, or a steering wheel or an accelerator serving as an input apparatus 109 sends a command to the information processing apparatus 107 to move the vehicle or to make a preparation for the movement, the information processing apparatus 107 operates the distance detection sensor 101. The distance detection sensor 101 outputs a signal including distance information indicating the distance to an object specified as the target 106. The information processing apparatus 107 processes this signal, for example, such that when the distance to the target 106 becomes too small, an alarm is displayed on the display apparatus 111. The information processing apparatus 107 may display, on the display apparatus 111, information indicating a distance to the target 106. The information processing apparatus 107 may control the driving apparatus 110 such as a brake, an engine, and/or the like according to the distance information to reduce or increase the speed of the vehicle. The information processing apparatus 107 may adjust a relative distance to another vehicle running ahead by driving the driving apparatus 110 such as the brake, the engine, and/or the like based on the distance information.

In a fourth example, the information processing system SYS is applied to a game system as described below. A user is allowed to input a command to a main game machine unit via the input apparatus 109 such as a controller such that the game machine is to operate in a gesture mode. In response to the command issued by the user, the information processing apparatus 107 operates the distance detection sensor 101, such that the distance detection sensor 101 detects an operation (gesture) of the user and generates distance information according to the detected operation. Based on the obtained distance information, the information processing apparatus 107 generates a video image in which a virtual character in a game moves in response to an operation performed by a user. The information processing apparatus 107 displays this video image on the display apparatus 111 connected to the main game machine unit (information processing apparatus 107).

The applications of the photoelectric conversion device according to the present disclosure are not limited to the examples described above, but the photoelectric conversion device may be applied to a wide variety of information processing systems.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2015-157641, filed Aug. 7, 2015, which is hereby incorporated by reference herein in its entirety.

What is claimed is:

1. A photoelectric conversion element comprising:
   a first photoelectric conversion unit configured to generate an electron;
   a second photoelectric conversion unit configured to generate a hole;
   a first floating diffusion region to which the electron generated in the first photoelectric conversion unit is transferred;
   a second floating diffusion region to which the hole generated in the second photoelectric conversion unit is transferred;
   an amplifying transistor including a gate electrically connected to the first floating diffusion region and the second floating diffusion region;
   a first charge ejection unit to which the electron generated in the first photoelectric conversion unit is ejected, the first charge ejection unit being arranged outside a position between the first photoelectric conversion unit and the first floating diffusion region; and
   a second charge ejection unit to which the hole generated in the second photoelectric conversion unit is ejected, the second charge ejection unit being arranged outside a position between the second photoelectric conversion unit and the second floating diffusion region,
   wherein the first photoelectric conversion unit and the second photoelectric conversion unit are arranged along a principal surface of a semiconductor substrate.

2. The photoelectric conversion element according to claim 1, wherein
   the first photoelectric conversion unit includes a first semiconductor region of P-type and an N-type semiconductor region disposed inside the first semiconductor region,
   the second photoelectric conversion unit includes a second semiconductor region of N-type and a P-type semiconductor region disposed inside the second semiconductor region,
   the first floating diffusion region includes an N-type semiconductor region disposed inside the first semiconductor region,
   the second floating diffusion region includes a P-type semiconductor region disposed inside the second semiconductor region,
   the first charge ejection unit includes an N-type semiconductor region disposed inside the first semiconductor region,
   the second charge ejection unit includes a P-type semiconductor region disposed inside the second semiconductor region,
   the N-type semiconductor region included in the first photoelectric conversion unit is disposed between the N-type semiconductor region included in the first charge ejection unit and the N-type semiconductor region included in the first floating diffusion region, and
   the second photoelectric conversion unit includes a P-type semiconductor region disposed between the P-type semiconductor region included in the second charge ejection unit and the P-type semiconductor region included in the second floating diffusion region.

3. The photoelectric conversion element according to claim 2, wherein the first photoelectric conversion unit and the second photoelectric conversion unit are arranged in a first direction, and the N-type semiconductor region included in the first charge ejection unit, the N-type semiconductor region included in the first photoelectric conversion unit, and the N-type semiconductor region included in the first floating diffusion region are arranged in this order in a second direction crossing the first direction, the first direction and the second direction are along the principal surface of the semiconductor substrate.

4. The photoelectric conversion element according to claim 3, wherein the P-type semiconductor region included in the second charge ejection unit, the P-type semiconductor region included in the second photoelectric conversion unit, and the P-type semiconductor region included in the second floating diffusion region are arranged in this order in the second direction.

5. The photoelectric conversion element according to claim 2, wherein
   at least a part of a first gate electrode for transferring the electron generated in the first photoelectric conversion unit to the first floating diffusion region is disposed above a region between the N-type semiconductor region in the first photoelectric conversion unit and the N-type semiconductor region included in the first floating diffusion region, and
   at least a part of a second gate electrode for transferring the hole generated in the second photoelectric conversion unit to the second floating diffusion region is disposed above a region between the P-type semiconductor region included in the second photoelectric conversion unit and the P-type semiconductor region included in the second floating diffusion region.

6. The photoelectric conversion element according to claim 5, wherein the first gate electrode and the second gate electrode are connected to a common node.

7. The photoelectric conversion element according to claim 2, wherein the N-type semiconductor region included in the first floating diffusion region and the P-type semiconductor region included in the second floating diffusion region are electrically connected to each other via an electrically conductive material.

8. The photoelectric conversion element according to claim 2, wherein the first semiconductor region of P-type included in the first photoelectric conversion unit is configured to be supplied with a first potential, the second semiconductor region of N-type included in the second photoelectric conversion unit is configured to be supplied with a second potential, and the first potential is lower than the second potential.

9. A photoelectric conversion element comprising:
  a first photoelectric conversion unit configured to generate an electron;
  a second photoelectric conversion unit configured to generate a hole;
  first and third floating diffusion regions to which the electron generated in the first photoelectric conversion unit is transferred;
  second and fourth floating diffusion regions to which the hole generated in the second photoelectric conversion unit is transferred;
  a first amplifying transistor including a gate electrically connected to the first floating diffusion region and the second floating diffusion region; and
  a second amplifying transistor including a gate electrically connected to the third floating diffusion region and the fourth floating diffusion region,
  wherein the first photoelectric conversion unit and the second photoelectric conversion unit are arranged along a principal surface of a semiconductor substrate.

10. The photoelectric conversion element according to claim 9, wherein
  the first photoelectric conversion unit includes a first semiconductor region of P-type and an N-type semiconductor region disposed in the inside of the first semiconductor region,
  the second photoelectric conversion unit includes a second semiconductor region of N-type and a P-type semiconductor region disposed inside the second semiconductor region,
  the first and the third floating diffusion regions each include an N-type semiconductor region disposed inside the first semiconductor region,
  the second and fourth floating diffusion regions each include a P-type semiconductor region disposed inside the second semiconductor region,
  the N-type semiconductor region included in the first photoelectric conversion unit is disposed between the N-type semiconductor region included in the first floating diffusion region and the N-type semiconductor region included in the third floating diffusion region, and
  the P-type semiconductor region included in the second photoelectric conversion unit is disposed between the P-type semiconductor region included in the second floating diffusion region and the P-type semiconductor region included in the fourth floating diffusion region.

11. The photoelectric conversion element according to claim 10, wherein the first photoelectric conversion unit and the second photoelectric conversion unit are arranged in a first direction, and the N-type semiconductor region included in the first floating diffusion region, the N-type semiconductor region included in the first photoelectric conversion unit, and the N-type semiconductor region included in the third floating diffusion region are arranged in this order in a second direction crossing the first direction, the first direction and the second direction are along a principal surface of the semiconductor substrate.

12. The photoelectric conversion element according to claim 11, wherein the P-type semiconductor region included in the second floating diffusion region, the P-type semiconductor region included in the second photoelectric conversion unit, and the P-type semiconductor region included in the fourth floating diffusion region are arranged in this order in the second direction.

13. The photoelectric conversion element according to claim 10, wherein
  at least a part of a first gate electrode for transferring the electron generated in the first photoelectric conversion unit to the first floating diffusion region is disposed above a region between the N-type semiconductor region included in the first photoelectric conversion unit and the N-type semiconductor region included in the first floating diffusion region,
  at least a part of a second gate electrode for transferring the hole generated in the second photoelectric conversion unit to the second floating diffusion region is disposed above a region between the P-type semiconductor region included in the second photoelectric conversion unit and the P-type semiconductor region included in the second floating diffusion region,
  the N-type semiconductor region included in the first floating diffusion region and the P-type semiconductor region included in the second floating diffusion region are connected to each other via a wiring and a contact plug connected to the N-type semiconductor region included in the first floating diffusion region and a contact plug connected to the P-type semiconductor region included in the second floating diffusion region, and
  the N-type semiconductor region included in the third floating diffusion region and the P-type semiconductor region included in the fourth floating diffusion region are connected to each other via a wiring and a contact plug connected to the N-type semiconductor region included in the third floating diffusion region, and a contact plug connected to the P-type semiconductor region included in the fourth floating diffusion region.

14. The photoelectric conversion element according to claim 13, wherein the first gate electrode and the second gate electrode are connected to a common node.

15. The photoelectric conversion element according to claim 10, wherein first semiconductor region of P-type included in the first photoelectric conversion unit is configured to be supplied with a first potential, the second semiconductor region of N-type included in the second photoelectric conversion unit is configured to be supplied with a second potential, and the first potential is lower than the second potential.

16. An information processing system comprising:
  a distance detection sensor including a photoelectric conversion apparatus and a light emitting apparatus, the photoelectric conversion apparatus including a plurality of photoelectric conversion elements according to claim 1; and
  an information processing apparatus configured to process information obtained from the distance detection sensor.

17. A vehicle comprising:
  the information processing system according to claim 16; and
  a driving apparatus controlled by the information processing system.

18. An information processing system comprising:
- a distance detection sensor including a photoelectric conversion apparatus and a light emitting apparatus, the photoelectric conversion apparatus including a plurality of photoelectric conversion elements according to claim 9; and
- an information processing apparatus configured to process information obtained from the distance detection sensor.

19. A vehicle comprising:
- the information processing system according to claim 18; and
- a driving apparatus controlled by the information processing system.

* * * * *